US012721231B2

(12) United States Patent
Heo et al.

(10) Patent No.: US 12,721,231 B2
(45) Date of Patent: Aug. 25, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Yuseon Heo, Suwon-si (KR); Jihye Shim, Suwon-si (KR); Junhyeong Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 445 days.

(21) Appl. No.: 18/483,545

(22) Filed: Oct. 10, 2023

(65) Prior Publication Data

US 2024/0136332 A1 Apr. 25, 2024

(30) Foreign Application Priority Data

Oct. 13, 2022 (KR) ........................ 10-2022-0131656

(51) Int. Cl.

| | |
|---|---|
| ***H10W 90/00*** | (2026.01) |
| ***H10W 70/65*** | (2026.01) |
| ***H10W 74/10*** | (2026.01) |
| *H10W 72/00* | (2026.01) |
| *H10W 72/50* | (2026.01) |

(52) U.S. Cl.

CPC ........... *H10W 90/00* (2026.01); *H10W 70/65* (2026.01); *H10W 74/117* (2026.01); *H10W 90/701* (2026.01); *H10W 72/01* (2026.01); *H10W 72/5445* (2026.01); *H10W 72/865* (2026.01); *H10W 90/732* (2026.01)

(58) Field of Classification Search

None

See application file for complete search history.

(56) References Cited

U.S. PATENT DOCUMENTS

| | | | |
|---|---|---|---|
| 7,649,248 | B2 | 1/2010 | Baek |
| 8,716,123 | B2 | 5/2014 | Kuo et al. |
| 10,007,177 | B2 | 6/2018 | Weng et al. |
| 2016/0148861 | A1 | 5/2016 | Liang et al. |
| 2019/0326222 | A1 | 10/2019 | Chavali et al. |
| 2021/0090973 | A1 | 3/2021 | Lee et al. |

(Continued)

FOREIGN PATENT DOCUMENTS

| | | | |
|---|---|---|---|
| KR | 10-0656587 | B1 | 12/2006 |
| KR | 10-2022-0004031 | A | 1/2022 |
| KR | 10-2022-0017022 | A | 2/2022 |

*Primary Examiner* — Michelle Mandala

(74) *Attorney, Agent, or Firm* — Wolf, Greenfield & Sacks, P.C.

(57) ABSTRACT

Provided is a method of manufacturing a semiconductor package, the method including forming a first wiring structure, forming a multi-layer photoresist on the first wiring structure, forming a plurality of openings in the multi-layer photoresist by exposing and developing the multi-layer photoresist, forming a plurality of conductive posts by forming a conductive material in the plurality of openings, removing the multi-layer photoresist, providing a semiconductor chip on the first wiring structure, forming an encapsulant on the semiconductor chip and the plurality of conductive posts, and forming a second wiring structure on the encapsulant, wherein the multi-layer photoresist includes at least two layers having different light transmittances.

20 Claims, 23 Drawing Sheets

(56) References Cited

U.S. PATENT DOCUMENTS

| | | | | |
|---|---|---|---|---|
| 2022/0115350 | A1 | 4/2022 | Mun et al. | |
| 2022/0359358 | A1* | 11/2022 | Kim | H10W 70/685 |
| 2023/0060946 | A1* | 3/2023 | Ha | H10W 70/65 |
| 2023/0065941 | A1* | 3/2023 | Tsai | H10P 72/74 |
| 2023/0101149 | A1* | 3/2023 | Yoo | H10W 40/22 257/773 |

* cited by examiner

SEMICONDUCTOR PACKAGE AND METHOD OF MANUFACTURING THE SAME

CROSS-REFERENCE TO RELATED APPLICATION

This application is based on and claims priority under 35 U.S.C. § 119 to Korean Patent Application No. 10-2022-0131656, filed on Oct. 13, 2022, in the Korean Intellectual Property Office, the disclosure of which is incorporated by reference herein in its entirety.

BACKGROUND

The inventive concept relates to a semiconductor package and a method of manufacturing the same, and more particularly, to a fan-out semiconductor package and a method of manufacturing the same.

Due to the rapid developments of the electronics industry and demands of users, electronic devices are becoming smaller and lighter, having more functions, and having higher capacity, and thus, highly integrated semiconductor chips are desired. Therefore, a semiconductor package including a highly integrated semiconductor chip having an increased number of connection terminals for input/output (I/O) and securing connection reliability has been devised. For example, to reduce or prevent interference between connection terminals, a fan-out semiconductor package having an increased distance between connection terminals is being developed.

SUMMARY

The inventive concept provides a semiconductor package with improved reliability and productivity due to accurate formation of conductive posts having a high aspect ratio according to design rules using a multi-layer photoresist and a method of manufacturing the semiconductor package.

In addition, the technical goals to be achieved by the inventive concept are not limited to the technical goals mentioned above, and other technical goals may be clearly understood by one of ordinary skill in the art from the following descriptions.

According to some embodiments of the inventive concept, there is provided a method of manufacturing a semiconductor package, the method including forming a first wiring structure, which includes a first insulation layer and a plurality of first wiring patterns that are in the first insulation layer and include a plurality of first connection pads, the first wiring structure including a chip mounting region and an outer region extending around (e.g., surrounding) the chip mounting region, forming (e.g., coating) a multi-layer photoresist on the first wiring structure, forming a plurality of openings in the multi-layer photoresist on the outer region by exposing and developing the multi-layer photoresist, forming a plurality of conductive posts respectively connected to (e.g. electrically connected to) the plurality of first connection pads arranged in the outer region by forming a conductive material in the plurality of openings (e.g., by filling the plurality of openings with the conductive material), removing the multi-layer photoresist, providing a semiconductor chip on the chip mounting region of the first wiring structure, forming an encapsulant in which the semiconductor chip and the plurality of conductive posts are disposed, and forming a second wiring structure on the encapsulant, the second wiring structure including a second insulation layer and a plurality of second wiring patterns that are in the second insulation layer and include a plurality of second connection pads respectively connected to (e.g., electrically connected to) the plurality of conductive posts, wherein the multi-layer photoresist includes at least two layers having different light transmittances. In some embodiments, the first insulation layer may surround the plurality of first wiring patterns, the encapsulant may surround the semiconductor chip and the plurality of conductive posts, and the second insulation layer may surround the plurality of second wiring patterns.

According to some other embodiments of the inventive concept, there is provided a method of manufacturing a semiconductor package, the method including forming a first wiring structure including a chip mounting region and an outer region extending around (e.g., surrounding) the chip mounting region, coating and baking a first photoresist layer having a first light transmittance on the first wiring structure, coating and baking a second photoresist layer having a second light transmittance on the first photoresist layer, coating and baking a third photoresist layer having a third light transmittance on the second photoresist layer, forming a plurality of openings in the first, second and third photoresist layers on the outer region by exposing and developing the first photoresist layer, the second photoresist layer, and the third photoresist layer, forming a plurality of conductive posts respectively in the plurality of openings by forming (e.g., filling) a conductive material in the plurality of openings through a single plating process, removing the first photoresist layer, the second photoresist layer, and the third photoresist layer, providing a semiconductor chip on the chip mounting region of the first wiring structure, forming an encapsulant in which the semiconductor chip and the plurality of conductive posts are disposed, and forming a second wiring structure on the encapsulant, wherein at least one of the first light transmittance, the second light transmittance, and the third light transmittance is different from the other light transmittances. In some embodiments, the encapsulant may surround the semiconductor chip and the plurality of conductive posts.

According to some other embodiments of the inventive concept, there is provided a semiconductor package including a first redistribution structure including a first redistribution insulation layer and a plurality of first redistribution patterns that are in the first redistribution insulation layer and include a plurality of first bottom surface connection pads and a plurality of first top surface connection pads, a first semiconductor chip mounted on a first chip mounting region of the first redistribution structure, a second redistribution structure on the first semiconductor chip and the first redistribution structure and including a second redistribution insulation layer and a plurality of second redistribution patterns that are in the second redistribution insulation layer and include a plurality of second bottom surface connection pads and a plurality of second top surface connection pads, a second semiconductor chip mounted on a second chip mounting region on the second redistribution structure, a plurality of conductive posts adjacent (e.g., arranged around) the first semiconductor chip and connecting (e.g., electrically connecting) ones of the plurality of first top surface connection pads to the plurality of second bottom surface connection pads, respectively, and an encapsulant that is in (e.g., fills) a space between the first redistribution structure and the second redistribution structure. The plurality of conductive posts and the first semiconductor chip are in the encapsulant. Each of the plurality of conductive posts includes a first portion, a second portion, and a third portion sequentially stacked on a respective one of the plurality of first top surface connection pads, at least one of horizontal widths of the first portion, the second portion, and the third portion is different from the other horizontal widths. Each of the plurality of conductive posts has a step difference in width between the first and second portions and has a step difference in width between the second and third portions. In some embodiments, each of the plurality of conductive posts may have a concavo-convex shape. In some embodiments, the first redistribution insulation layer may surround the plurality of first redistribution patterns, the second redistribution insulation layer may surround the plurality of second redistribution patterns, and the encapsulant may surround the plurality of conductive posts and the first semiconductor chip.

According to some other embodiments of the inventive concept, there is provided a method of manufacturing a semiconductor package, the method including forming a multi-layer photoresist on the first wiring structure, the multi-layer photoresist including first and second photoresist layers, and the first photoresist layer extending between the first wiring structure and the second photoresist layer and having a first light transmittance different from a second light transmittance of the second photoresist layer, forming a plurality of openings in the multi-layer photoresist, forming a plurality of conductive posts in the plurality of openings, respectively, removing the multi-layer photoresist, providing a semiconductor chip on the first wiring structure, the semiconductor chip being spaced apart from the plurality of conductive posts, forming an encapsulant in which the semiconductor chip and the plurality of conductive posts are disposed, and forming a second wiring structure on the encapsulant, the second wiring structure comprising a second insulation layer and a plurality of second wiring patterns that are in the second insulation layer and comprise a plurality of second connection pads. Each of the plurality of conductive posts may be electrically connected to a respective one of the plurality of first connection pads and a respective one of plurality of second connection pads.

BRIEF DESCRIPTION OF THE DRAWINGS

Some example embodiments of the inventive concept will be more clearly understood from the following detailed description taken in conjunction with the accompanying drawings in which:

FIG. 1 is a cross-sectional view of main components of a semiconductor package according to some embodiments of the present inventive concept;

FIGS. 6 to 16 are diagrams showing a method of manufacturing a semiconductor package according to some embodiments of the present inventive concept;

DETAILED DESCRIPTION

Figure 1:
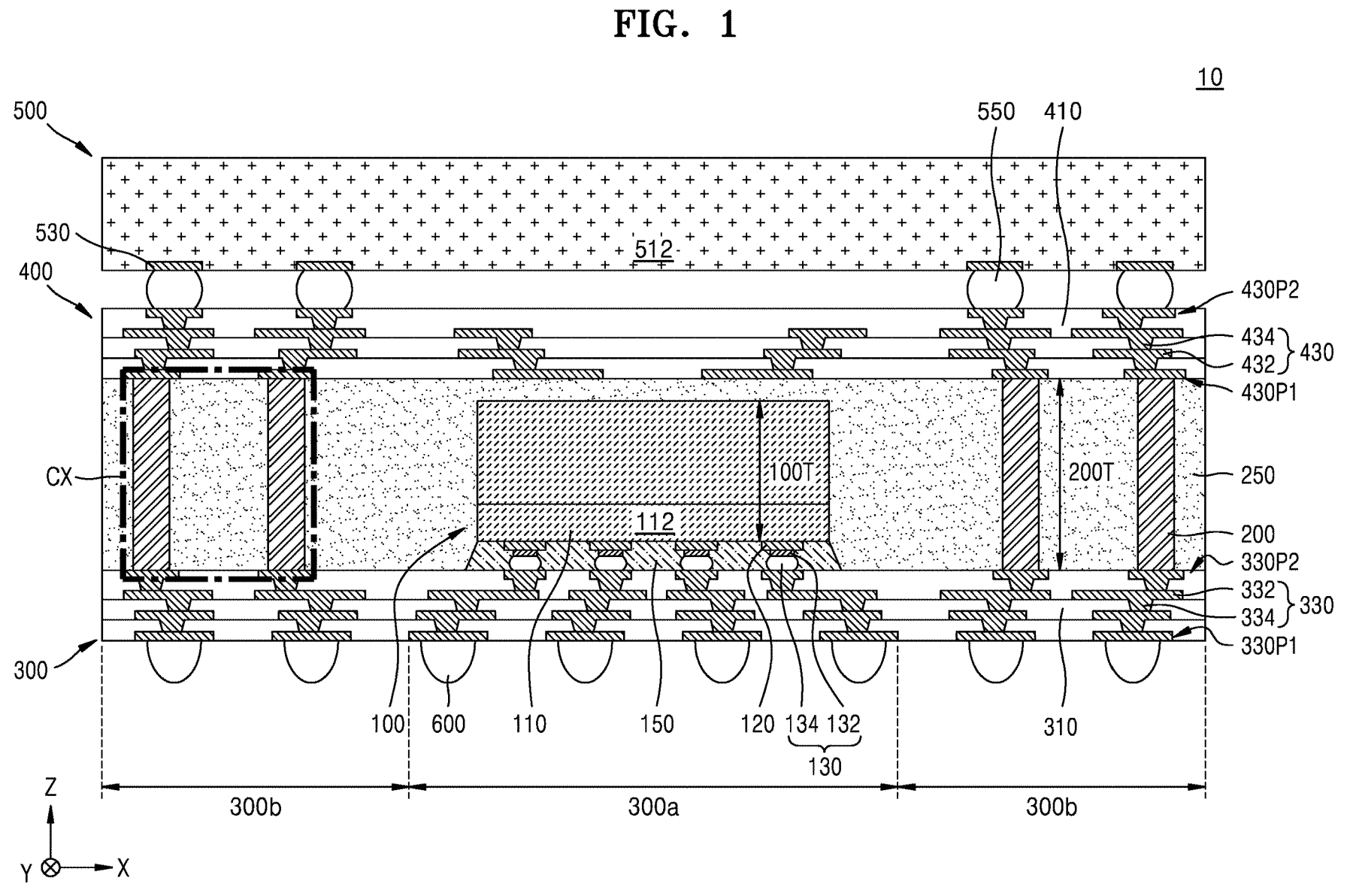
Figure 2A:
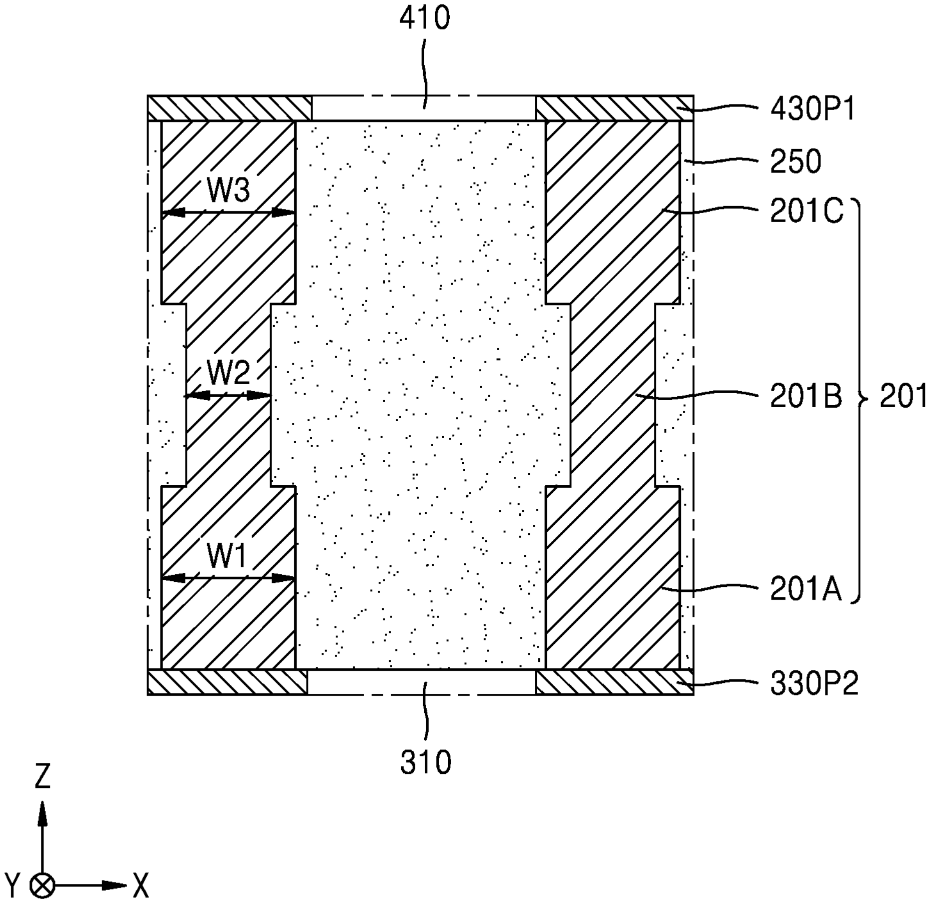
FIGS. 2A and 2B are each enlarged cross-sectional views of a portion CX of FIG. 1 according to some embodiments of the present inventive concept.

FIG. 1 is a cross-sectional view of a semiconductor package according to some embodiments of the present inventive concept. FIG. 1 shows various elements/components of the semiconductor package including main components thereof.

Referring to FIG. 1, a semiconductor package 10 may include a first semiconductor chip 100, conductive posts 200 arranged around the first semiconductor chip 100, a first wiring structure 300 disposed below the first semiconductor chip 100, a second wiring structure 400 disposed over the first semiconductor chip 100, and a second semiconductor chip 500 disposed above the second wiring structure 400.

The semiconductor package 10 may have a package-on-package (PoP) structure. In detail, the semiconductor package 10 may be a fan-out semiconductor package in which the horizontal width and the horizontal area of the first wiring structure 300 are greater than the horizontal width and the horizontal area of the first semiconductor chip 100. According to some embodiments, the semiconductor package 10 may be a Fan Out Wafer Level Package (FOWLP) or a Fan Out Panel Level Package (FOPLP). The first wiring structure 300 may include a chip mounting region 300*a* and an outer region 300*b* extending around (e.g., surrounding) the chip mounting region 300*a*.

According to some embodiments, the first wiring structure 300 and the second wiring structure 400 may be formed through a redistribution process. Therefore, the first wiring structure 300 and the second wiring structure 400 may be respectively referred to as a first redistribution structure and a second redistribution structure or may be respectively referred to as a lower redistribution structure and an upper redistribution structure.

The first wiring structure 300 may include a first redistribution insulation layer 310 and a plurality of first redistribution patterns 330. The first redistribution insulation layer 310 may cover the plurality of first redistribution patterns 330. According to some embodiments, the first wiring structure 300 may include a plurality of stacked first redistribution insulation layers 310. The first redistribution insulation layer 310 may include, for example, photo imageable dielectric (PID) or photosensitive polyimide (PSPI).

The plurality of first redistribution patterns 330 may include a plurality of first redistribution line patterns 332 and a plurality of first redistribution vias 334. For example, the plurality of first redistribution patterns 330 may include a metal (e.g., copper (Cu), aluminum (Al), tungsten (W), titanium (Ti), tantalum (Ta), indium (In), Molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof). However, the inventive concept is not limited thereto.

The plurality of first redistribution line patterns 332 may be arranged on at least one of the top surface and the bottom surface of the first redistribution insulation layer 310. For example, when the first wiring structure 300 includes the plurality of stacked first redistribution insulation layers 310, the plurality of first redistribution line patterns 332 may be arranged on the top surface of the uppermost first redistribution insulation layer 310, on the bottom surface of the lowermost first redistribution insulation layer 310, and between first redistribution insulation layers 310 adjacent to each other.

The plurality of first redistribution vias 334 may penetrate through the first redistribution insulation layer 310 and be connected to some of the plurality of first redistribution line patterns 332. According to some embodiments, the plurality of first redistribution vias 334 may have a tapered shape in which the horizontal width thereof increases upward in a vertical direction (e.g., a Z direction in FIG. 1). Each of a direction X and a direction Y may be a horizontal direction. The direction X may be a first horizontal direction, and the direction Y may be a second horizontal direction. The Z direction may be perpendicular to the direction X and the direction Y.

According to some embodiments, some of the plurality of first redistribution line patterns 332 may be formed together and integrated with some of the plurality of first redistribution vias 334. For example, a first redistribution line pattern 332 and a first redistribution via 334 contacting the bottom surface of the first redistribution line pattern 332 may be formed together and integrated with each other.

From among the plurality of first redistribution patterns 330, some arranged adjacent to the bottom surface of the first wiring structure 300 may be referred to as a plurality of first bottom surface connection pads 330P1, and some others arranged adjacent to the top surface of the first wiring structure 300 may be referred to as a plurality of first top surface connection pads 330P2. In other words, the plurality of first bottom surface connection pads 330P1 may be some arranged adjacent to the bottom surface of the first wiring structure 300 from among the plurality of first redistribution line patterns 332, and the plurality of first top surface connection pads 330P2 may be some arranged adjacent to the top surface of the first wiring structure 300 from among the plurality of first redistribution line patterns 332.

A plurality of external connection terminals 600 may be attached to the plurality of first bottom surface connection pads 330P1, respectively. The plurality of external connection terminals 600 may connect the semiconductor package 10 to the outside. According to some embodiments, the plurality of external connection terminals 600 may include solder bumps or solder balls. Unlike this, a plurality of chip connecting members 130 may be attached to some of the plurality of first top surface connection pads 330P2, and a plurality of conductive posts 200 may be attached to the other first top surface connection pads 330P2.

The plurality of first top surface connection pads 330P2 may be arranged on the top surface of the first redistribution insulation layer 310. For example, when the first wiring structure 300 includes a plurality of stacked first redistribution insulation layers 310, the plurality of first top surface connection pads 330P2 may be arranged on the top surface of the uppermost first redistribution insulation layer 310.

At least one first semiconductor chip 100 may be mounted on the first wiring structure 300. In other words, one first semiconductor chip 100 or a plurality of first semiconductor chips 100 may be provided. The first semiconductor chip 100 may include a semiconductor substrate 110 having an active surface and an inactive surface opposite to each other, a semiconductor device 112 formed on the active surface of the semiconductor substrate 110, and a plurality of chip pads 120 arranged on a first surface of the first semiconductor chip 100. For example, the first semiconductor chip 100 may have a thickness 100T of about 150 μm or greater.

Here, the first surface and a second surface of the first semiconductor chip 100 opposite to each other, and the second surface of the first semiconductor chip 100 refers to the inactive surface of the semiconductor substrate 110. Since the active surface of the semiconductor substrate 110 is adjacent to the first surface of the first semiconductor chip 100, the active surface of the semiconductor substrate 110 and the first surface of the first semiconductor chip 100 are not distinguished in the drawing.

According to some embodiments, the first semiconductor chip 100 has a face down arrangement in which the first surface of the first semiconductor chip 100 faces the first wiring structure 300 and may be mounted on the top surface of the first wiring structure 300. In this case, the first surface of the first semiconductor chip 100 may be referred to as the bottom surface of the first semiconductor chip 100, and the second surface of the first semiconductor chip 100 may be referred to as the top surface of the first semiconductor chip 100.

The plurality of chip connecting members 130 may be provided between the plurality of chip pads 120 of the first semiconductor chip 100 and some of the plurality of first top surface connection pads 330P2 of the first wiring structure 300. For example, the plurality of chip connecting members 130 may each be a solder ball or a micro bump. The first semiconductor chip 100 and the first redistribution patterns 330 of the first wiring structure 300 may be electrically connected to each other through the plurality of chip connecting members 130. The plurality of chip connecting members 130 may each include an under bump metal (UBM) layer 132 disposed on a chip pad 120 and a conductive connection member 134 covering the UBM layer 132. The plurality of chip connecting members 130 may include, for example, copper (Cu), aluminum (Al), silver (Ag), tin (Tin), gold (Au), or solder. However, the inventive concept is not limited thereto.

The semiconductor substrate 110 may include, for example, a semiconductor material (e.g., silicon (Si) or germanium (Ge)). In some embodiments, the semiconductor substrate 110 may include a compound semiconductor material (e.g., silicon carbide (SiC), gallium arsenide (GaAs), indium arsenide (InAs), and indium phosphide (InP)). The semiconductor substrate 110 may include a well doped with an impurity, which is a conductive region. The semiconductor substrate 110 may have various device isolation structures (e.g., a shallow trench isolation (STI) structure).

The semiconductor device 112 including a plurality of individual devices of various types may be formed on the active surface of the semiconductor substrate 110. The plurality of individual devices may be electrically connected to the conductive region of the semiconductor substrate 110. The semiconductor device 112 may further include conductive wires or conductive plugs electrically connecting the plurality of individual devices to the conductive region of the semiconductor substrate 110. Also, the individual devices may each be electrically separated from other neighboring individual devices by an insulation film.

According to some embodiments, the first semiconductor chip 100 may include a logic device. For example, the first semiconductor chip 100 may be a central processing unit chip, a graphics processing unit chip, or an application processor chip. According to some other embodiments, when the semiconductor package 10 includes a plurality of first semiconductor chips 100, one of the plurality of first semiconductor chips 100 may be a central processing unit chip, a graphics processing unit chip, or an application processor chip, and another one of the plurality of first semiconductor chips 100 may be a memory semiconductor chip including a memory device.

For example, the memory device may be a non-volatile memory device (e.g., flash memory, phase-change random access memory (PRAM), magnetic random access memory (MRAM), ferroelectric random access memory (FeRAM), or resistive random access memory (RRAM)). According to some embodiments, the memory device may be a volatile memory device (e.g., dynamic random access memory (DRAM) or static random access memory (SRAM)).

The second wiring structure 400 may include a second redistribution insulation layer 410 and a plurality of second redistribution patterns 430. The second redistribution insulation layer 410 may cover the plurality of second redistribution patterns 430. The second redistribution insulation layer 410 may include, for example, PID or PSPI.

According to some embodiments, the second wiring structure 400 may include a plurality of stacked second redistribution insulation layers 410. The plurality of second redistribution patterns 430 may include a plurality of second redistribution line patterns 432 and a plurality of second redistribution vias 434. The plurality of second redistribution patterns 430 may include a metal or a metal alloy. According to some embodiments, the plurality of second redistribution patterns 430 may be formed by stacking a metal or a metal alloy on a seed layer.

The plurality of second redistribution line patterns 432 may be arranged on at least one of the top surface and the bottom surface of the second redistribution insulation layer 410. For example, when the second wiring structure 400 includes the plurality of stacked second redistribution insulation layers 410, the plurality of second redistribution line patterns 432 may be arranged on the top surface of the uppermost second redistribution insulation layer 410, on the bottom surface of the lowermost second redistribution insulation layer 410, and between second redistribution insulation layers 410 adjacent to each other.

From among the plurality of second redistribution patterns 430, some arranged adjacent to the bottom surface of the second wiring structure 400 may be referred to as a plurality of second bottom surface connection pads 430P1, and some others arranged adjacent to the top surface of the second wiring structure 400 may be referred to as a plurality of second top surface connection pads 430P2. For example, the plurality of second bottom surface connection pads 430P1 may be some arranged adjacent to the bottom surface of the second wiring structure 400 from among the plurality of second redistribution line patterns 432, and the plurality of second top surface connection pads 430P2 may be some arranged adjacent to the top surface of the second wiring structure 400 from among the plurality of second redistribution line patterns 432. According to some other embodiments, the plurality of second bottom surface connection pads 430P1 may be some of the plurality of second redistribution vias 434 arranged adjacent to the bottom surface of the second wiring structure 400.

The second semiconductor chip 500 may include a second semiconductor device 512 and a plurality of second pads 530. The second semiconductor chip 500 may be electrically connected to the second wiring structure 400 through a plurality of internal connection terminals 550 between the plurality of second pads 530 and the plurality of second top surface connection pads 430P2. The second semiconductor chip 500 may be mounted on the second wiring structure 400, such that the plurality of second pads 530 face the second wiring structure 400.

According to some embodiments, the second semiconductor chip 500 may be electrically connected to the plurality of first redistribution patterns 330 of the first wiring structure 300 through the plurality of internal connection terminals 550 attached to the plurality of second pads 530, the plurality of second redistribution patterns 430, and the plurality of conductive posts 200.

According to some embodiments, the second semiconductor device 512 may be a memory device. For example, the memory device may be a non-volatile memory device (e.g., flash memory, PRAM, MRAM, FeRAM, or RRAM). According to some embodiments, the memory device may be a volatile memory device (e.g., DRAM or SRAM).

The plurality of second bottom surface connection pads 430P1 may be arranged on the bottom surface of the second redistribution insulation layer 410. For example, when the second wiring structure 400 includes the plurality of stacked second redistribution insulation layers 410, the plurality of second bottom surface connection pads 430P1 may be arranged on the bottom surface of the lowermost second redistribution insulation layer 410.

The plurality of second top surface connection pads 430P2 may be arranged on the top surface of the second redistribution insulation layer 410. For example, when the second wiring structure 400 includes the plurality of stacked second redistribution insulation layers 410, the plurality of second top surface connection pads 430P2 may be arranged on the top surface of the topmost second redistribution insulation layer 410.

The plurality of second redistribution vias 434 may penetrate through the second redistribution insulation layer 410 and contact and be connected to some of the plurality of second redistribution line patterns 432. According to some embodiments, some of the plurality of second redistribution line patterns 432 may be formed together and integrated with some of the plurality of second redistribution vias 434. For example, a second redistribution line pattern 432 and a second redistribution via 434 contacting the bottom surface of the second redistribution line pattern 432 may be formed together and integrated with each other.

According to some embodiments, the plurality of second redistribution vias 434 may have a tapered shape in which the horizontal width thereof decreases downward in the vertical direction. In other words, the plurality of first redistribution vias 334 and the plurality of second redistribution vias 434 may extend in the same direction and horizontal widths thereof may decrease in the same direction. However, the inventive concept is not limited thereto.

Here, the first redistribution insulation layer 310, the first redistribution patterns 330, the first redistribution line patterns 332, and the first redistribution vias 334 may be referred to as a first insulation layer, first wiring patterns, first wiring line patterns, and first wiring vias, respectively. Also, the second redistribution insulation layer 410, the second redistribution patterns 430, the second redistribution line patterns 432, and the second redistribution vias 434 may be referred to as a second insulation layer, second wiring patterns, second wiring line patterns, and second wiring vias, respectively.

An encapsulant 250 may cover the first semiconductor chip 100 on the top surface of the first wiring structure 300. The encapsulant 250 may fill a space between the first wiring structure 300 and the second wiring structure 400. For example, the encapsulant 250 may have a thickness from about 150 μm to about 500 μm. For example, the encapsulant 250 may be a molding member including an epoxy mold compound (EMC). The encapsulant 250 may further include a filler.

According to some embodiments, an underfill layer 150 surrounding the plurality of chip connecting members 130 may be provided between the first semiconductor chip 100 and the first wiring structure 300. According to some embodiments, the underfill layer 150 may fill a space between the first semiconductor chip 100 and the first wiring structure 300 and may cover lower portions of side surfaces of the first semiconductor chip 100. The underfill layer 150 may be formed through, for example, a capillary underfill process and may include an epoxy resin.

According to some embodiments, side surfaces of the first wiring structure 300, side surfaces of the encapsulant 250, and side surfaces of the second wiring structure 400 may be aligned with one another in the vertical direction to be coplanar with one another.

The plurality of conductive posts 200 may electrically interconnect the first wiring structure 300 and the second wiring structure 400 by penetrating through the encapsulant 250. The encapsulant 250 may surround the plurality of conductive posts 200.

The plurality of conductive posts 200 may be provided between the first wiring structure 300 and the second wiring structure 400 to be spaced apart from the first semiconductor chip 100 in a horizontal direction (e.g., the direction X or the direction Y). For example, the plurality of conductive posts 200 may be spaced apart from the first semiconductor chip 100 in a horizontal direction and arranged around the first semiconductor chip 100 on an outer region 300*b* of the first wiring structure 300.

The plurality of conductive posts 200 may be provided between the plurality of first top surface connection pads 330P2 and the plurality of second bottom surface connection pads 430P1. The bottom surfaces of the plurality of conductive posts 200 may be electrically connected to the plurality of first redistribution patterns 330 by contacting the plurality of first top surface connection pads 330P2 of the first wiring structure 300, and the top surface of the conductive posts 200 may be electrically connected to the plurality of second redistribution patterns 430 by contacting the plurality of second bottom surface connection pads 430P1 of the second wiring structure 400.

For example, a thickness 200T of each of the plurality of conductive posts 200 may be from about 200 μm to about 500 μm, and the horizontal width of each of the plurality of conductive posts 200 may be from about 120 μm to about 200 μm. The aspect ratio of each of the plurality of conductive posts 200, i.e., a ratio of the height with respect to the horizontal width, may be greater than 1. According to some embodiments, the plurality of conductive posts 200 may include copper (Cu) or a Cu alloy, but the inventive concept is not limited thereto.

The bottom surfaces of the plurality of conductive posts 200 may contact the top surfaces of the first top surface connection pads 330P2, respectively. The top surfaces of the plurality of conductive posts 200 may contact the bottom surfaces of the second bottom surface connection pads 430P1, respectively.

According to some embodiments, the horizontal width and the horizontal area of a first top surface connection pad 330P2 contacting a conductive post 200 may be greater than the horizontal width and the horizontal area of the conductive post 200. For example, the entire bottom surface of the conductive post 200 contacts the top surface of the first top surface connection pad 330P2, but a portion of the top surface of the first top surface connection pad 330P2 may not contact the conductive post 200.

According to some embodiments, the horizontal width and the horizontal area of a second bottom surface connection pad 430P1 contacting the conductive post 200 may be greater than the horizontal width and the horizontal area of the conductive post 200. For example, the entire top surface of the conductive post 200 contacts the bottom surface of the second bottom surface connection pad 430P1, but a portion of the bottom surface of the second bottom surface connection pad 430P1 may not contact the conductive post 200.

Due to the rapid developments of the electronics industry and demands of users, electronic devices are becoming smaller and lighter, having more functions, and having higher capacity, and thus, highly integrated semiconductor chips are demanded. Therefore, to improve heat dissipation characteristics of the first semiconductor chip 100, the thickness 100T of the first semiconductor chip 100 is continuously increasing. As such, the increase in the thickness 100T of the first semiconductor chip 100 also affects the thickness 200T of the plurality of conductive posts 200 electrically interconnecting the first wiring structure 300 and the second wiring structure 400.

Generally, an exposure process using a photoresist and a development process are used to form conductive posts. Therefore, as the height of conductive posts increases rapidly, the thickness of the photoresist also needs to be increased. However, at a thickness equal to greater than a certain level, the light transmittance of the photoresist is significantly reduced, and thus, it is difficult to manufacture a conductive post satisfying an increased thickness through a single exposure process, a single development process, and a single plating process.

As a result, to manufacture a conductive post having an increased thickness, the manufacturing process of the conductive post needs to be performed twice or a greater number of times. In other words, an exposure process and a development process are performed twice, and a double plating process is used accordingly. However, this may cause addition of a considerable number of operations, thereby deteriorating productivity.

To solve the problem, in the semiconductor package 10 according to the inventive concept, according to a method S10 of manufacturing a semiconductor package as described later (refer to FIG. 5), the plurality of conductive posts 200 having a high aspect ratio may be accurately formed according to design rules through a single exposure process, a single development process, and a single plating process by using a multi-layer photoresist (PR, refer to FIG. 10) including layers having different light transmittances.

Ultimately, according to the method S10 (refer to FIG. 5) of manufacturing a semiconductor package using a multi-layer photoresist PR (refer to FIG. 10), the reliability and productivity of the semiconductor package 10 may be improved.

Figure 2B:
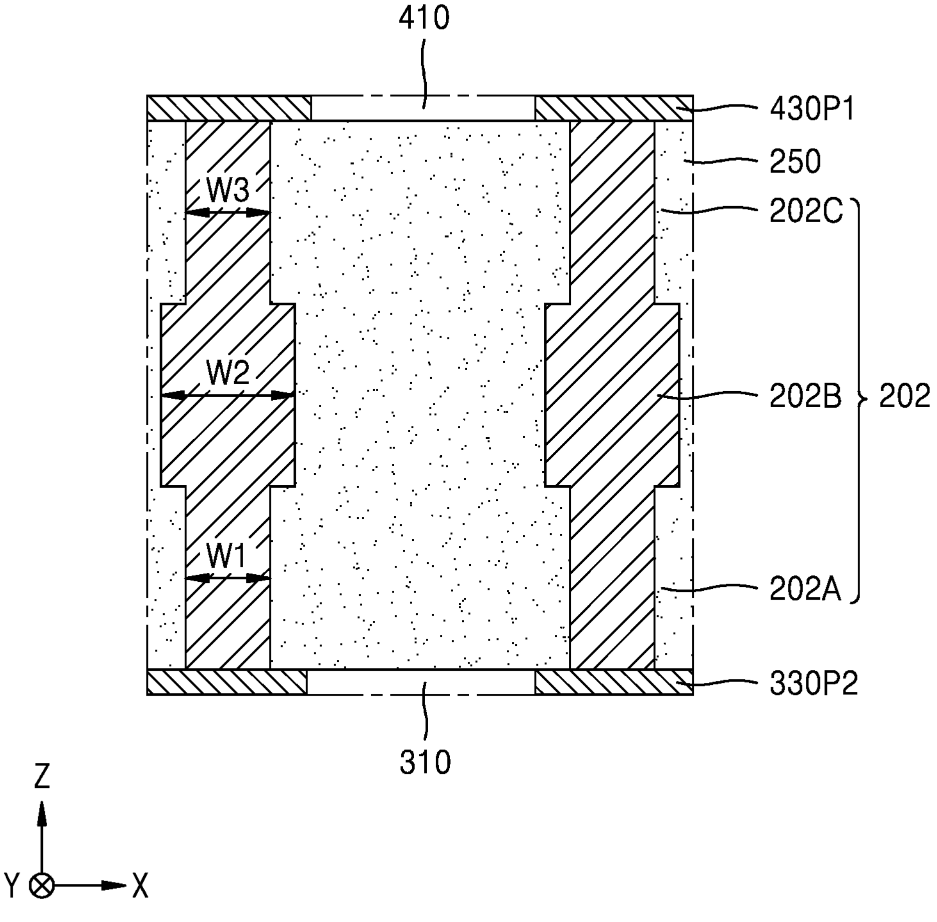

FIGS. 2A and 2B are each enlarged cross-sectional views of a portion CX of FIG. 1 according to some embodiments of the present inventive concept.

Referring to FIG. 2A, conductive posts 201 may have rotational symmetry around the axis in a vertical direction (e.g., the Z direction in FIG. 1) and may each have a cylindrical shape with a concave center.

A conductive post 201 may sequentially include a first portion 201A, a second portion 201B, and a third portion 201C. The bottom surface of the first portion 201A may contact the top surface of the first top surface connection pad 330P2, and the top surface of the third portion 201C may contact the bottom surface of the second bottom surface connection pad 430P1.

In the conductive post 201, the first portion 201A, the second portion 201B, and the third portion 201C may be formed to have concavo-convex shapes having step differences from one another. In detail, the conductive post 201 may have a cylindrical shape in which the second portion 201B corresponds to a concave portion. In other words, a first horizontal width W1 of the first portion 201A and a third horizontal width W3 of the third portion 201C may be substantially the same, and a second horizontal width W2 of the second portion 201B may be less than the first horizontal width W1 and the third horizontal width W3. Also, ratios of heights of the first portion 201A, the second portion 201B, and the third portion 201C in the conductive post 201 may be substantially the same, but the inventive concept is not limited thereto.

The structural features of the conductive post 201 as described above may appear as a multi-layer photoresist PR (refer to FIG. 10) including layers having different light transmittances is used, as in the method S10 of manufacturing a semiconductor package (refer to FIG. 5) described later.

Referring to FIG. 2B, conductive posts 202 may have rotational symmetry around the axis in a vertical direction (e.g., the Z direction) and may each have a cylindrical shape with a convex center.

A conductive post 202 may sequentially include a first portion 202A, a second portion 202B, and a third portion 202C. The bottom surface of the first portion 202A may contact the top surface of the first top surface connection pad 330P2, and the top surface of the third portion 202C may contact the bottom surface of the second bottom surface connection pad 430P1.

In the conductive post 202, the first portion 202A, the second portion 202B, and the third portion 202C may be formed to have concavo-convex shapes having step differences from one another. In detail, the conductive post 202 may have a cylindrical shape in which the second portion 202B corresponds to a convex portion. In other words, a first horizontal width W1 of the first portion 202A and a third horizontal width W3 of the third portion 202C may be substantially the same, and a second horizontal width W2 of the second portion 202B may be greater than the first horizontal width W1 and the third horizontal width W3. Also, ratios of heights of the first portion 202A, the second portion 202B, and the third portion 202C in the conductive post 202 may be substantially the same, but the inventive concept is not limited thereto.

The structural features of the conductive post 202 as described above may appear as a multi-layer photoresist PR (refer to FIG. 10) including layers having different light transmittances is used, as in the method S10 of manufacturing a semiconductor package (refer to FIG. 5) described later.

Figure 3A:
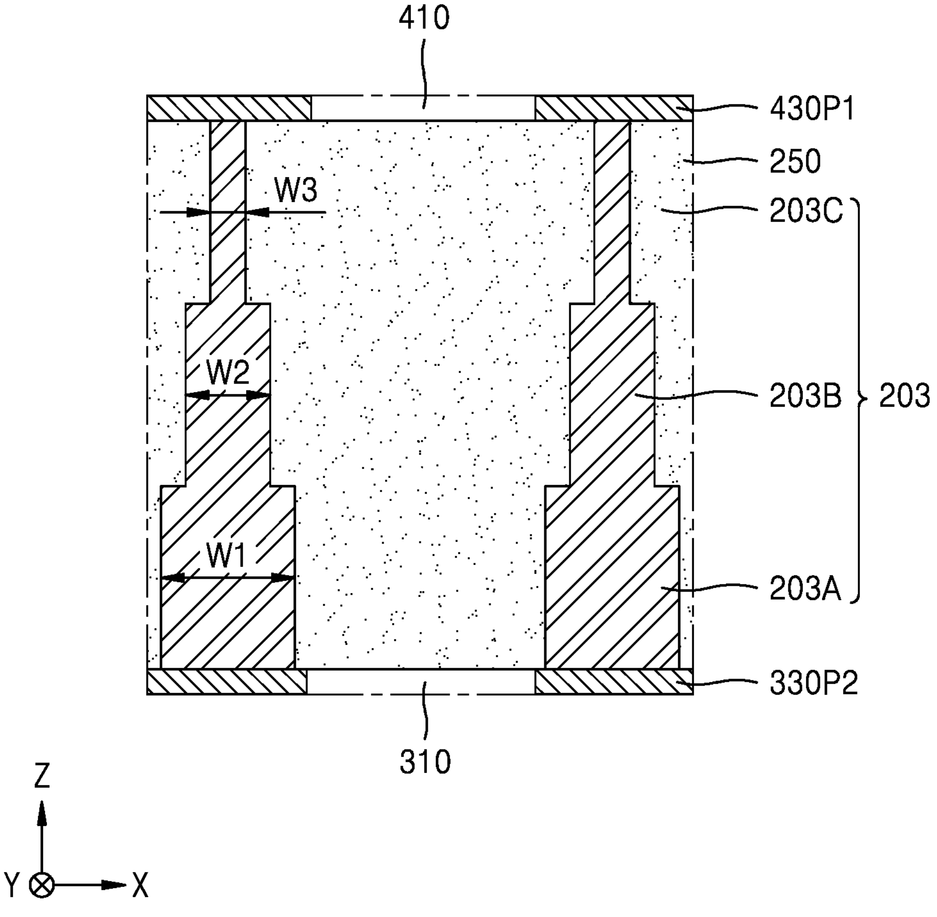
FIGS. 3A and 3B are each enlarged cross-sectional views of a portion CX of FIG. 1 according to some other embodiments of the present inventive concept.
Figure 3B:
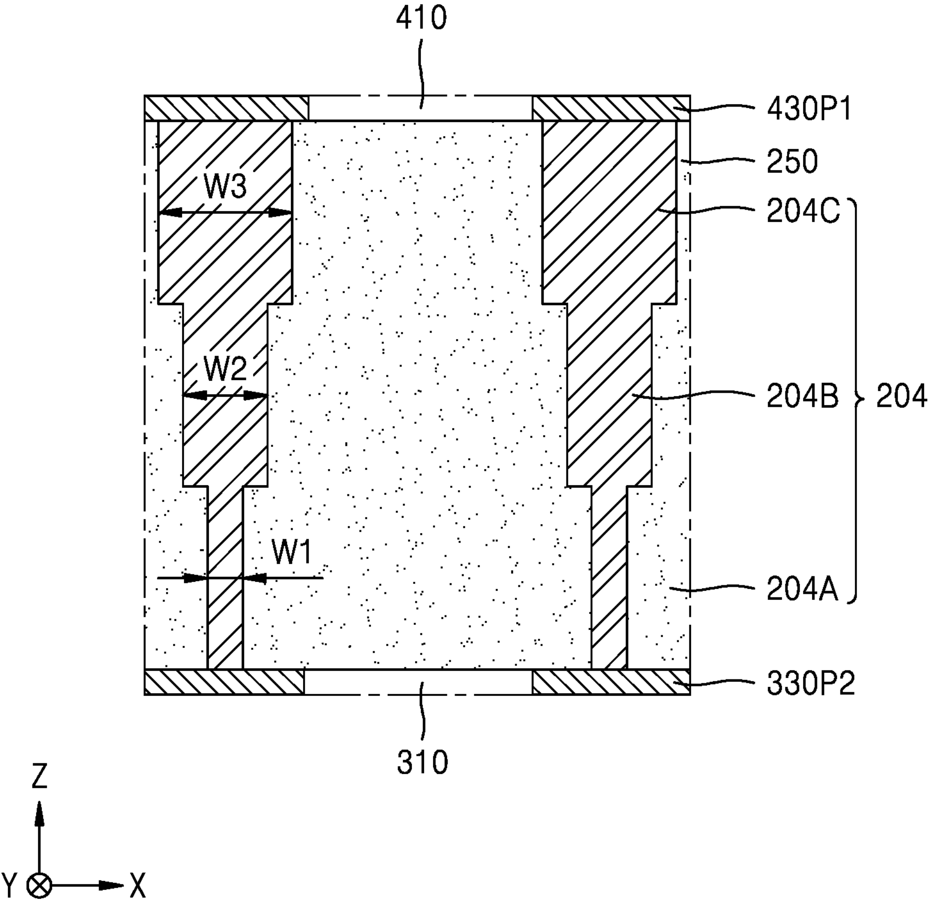

FIGS. 3A and 3B are each enlarged cross-sectional views a portion CX of FIG. 1 according to some other embodiments of the present inventive concept.

Referring to FIG. 3A, conductive posts 203 may have rotational symmetry around the axis in a vertical direction (e.g., the Z direction) and may each have a pyramidal cross-sectional shape.

A conductive post 203 may sequentially include a first portion 203A, a second portion 203B, and a third portion 203C. The bottom surface of the first portion 203A may contact the top surface of the first top surface connection pad 330P2, and the top surface of the third portion 203C may contact the bottom surface of the second bottom surface connection pad 430P1.

In the conductive post 203, the first portion 203A, the second portion 203B, and the third portion 203C may be formed to have concavo-convex shapes having step differences from one another. In detail, the conductive post 203 may have a pyramidal shape with a stepped cross-section. In other words, the first horizontal width W1 of the first portion 203A may be greater than the second horizontal width W2 of the second portion 203B, and the second horizontal width W2 of the second portion 203B may be greater than the third horizontal width W3 of the third portion 203C. Also, ratios of heights of the first portion 203A, the second portion 203B, and the third portion 203C in the conductive post 203 may be substantially the same, but the inventive concept is not limited thereto.

The structural features of the conductive post 203 as described above may appear as a multi-layer photoresist PR (refer to FIG. 10) including layers having different light transmittances is used, as in the method S10 of manufacturing a semiconductor package (refer to FIG. 5) described later.

Referring to FIG. 3B, conductive posts 204 may have rotational symmetry around the axis in a vertical direction (e.g., the Z direction) and may each have an inverted pyramidal cross-sectional shape.

A conductive post 204 may sequentially include a first portion 204A, a second portion 204B, and a third portion 204C. The bottom surface of the first portion 204A may contact the top surface of the first top surface connection pad 330P2, and the top surface of the third portion 204C may contact the bottom surface of the second bottom surface connection pad 430P1.

In the conductive post 204, the first portion 204A, the second portion 204B, and the third portion 204C may be formed to have concavo-convex shapes having step differences from one another. In detail, the conductive post 204 may have an inverted pyramidal shape with a stepped cross-section. In other words, the first horizontal width W1 of the first portion 204A may be less than the second horizontal width W2 of the second portion 204B, and the second horizontal width W2 of the second portion 204B may be less than the third horizontal width W3 of the third portion 204C. Also, ratios of heights of the first portion 204A, the second portion 204B, and the third portion 204C in the conductive post 204 may be substantially the same, but the inventive concept is not limited thereto.

The structural features of the conductive post 204 as described above may appear as a multi-layer photoresist PR (refer to FIG. 10) including layers having different light transmittances is used, as in the method S10 of manufacturing a semiconductor package (refer to FIG. 5) described later.

In some embodiments, the conductive post (e.g., the conductive post 201 in FIG. 2A) has a step difference in width between the first portion (e.g., the first portion 201A in FIG. 2A) and the second portion (e.g., the second portion 201B in FIG. 2A) and has a step difference in width between the second portion (e.g., the second portion 201B in FIG. 2A) and the third portion (the third portion 201C in FIG. 2A), as illustrated in FIGS. 2A, 2B, 3A and 3B. Further, in some embodiments, thicknesses of the first, second and third portions (e.g., the first, second and third portions 201A, 201B, and 201C in FIG. 2A) in the vertical direction may be equal, as illustrated in FIGS. 2A, 2B, 3A and 3B.

Figure 4A:
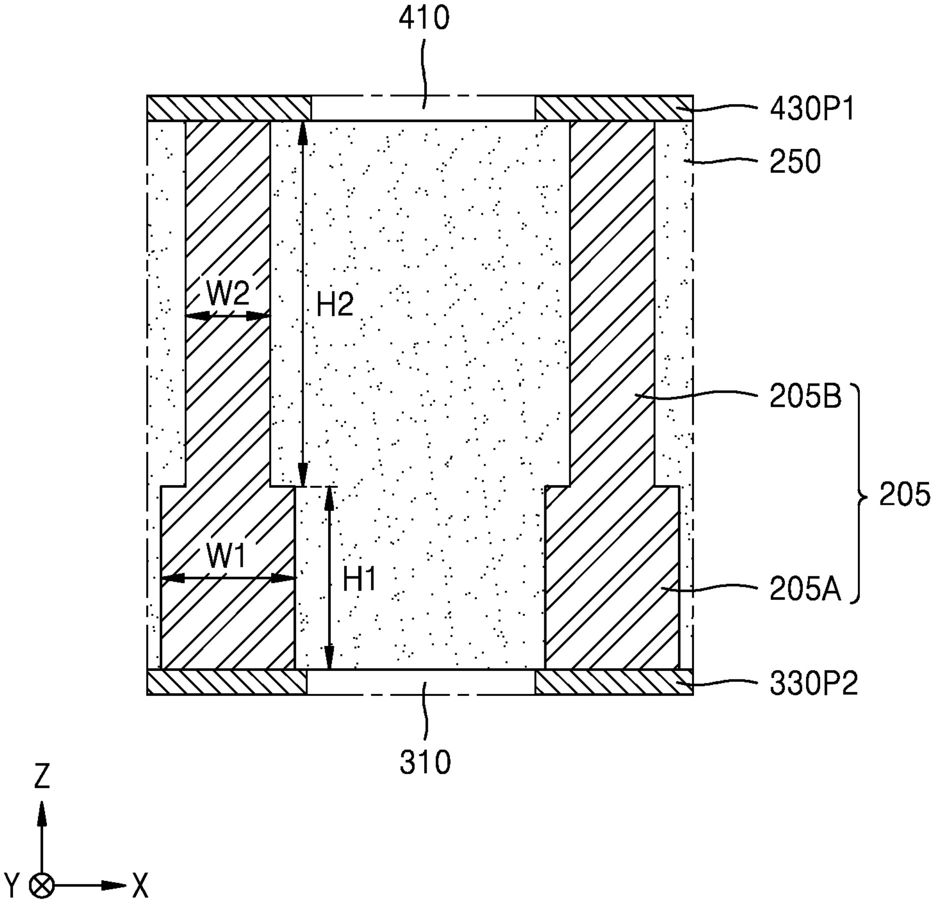
FIGS. 4A and 4B are each enlarged cross-sectional views of a portion CX of FIG. 1 according to some other embodiments of the present inventive concept.
Figure 4B:
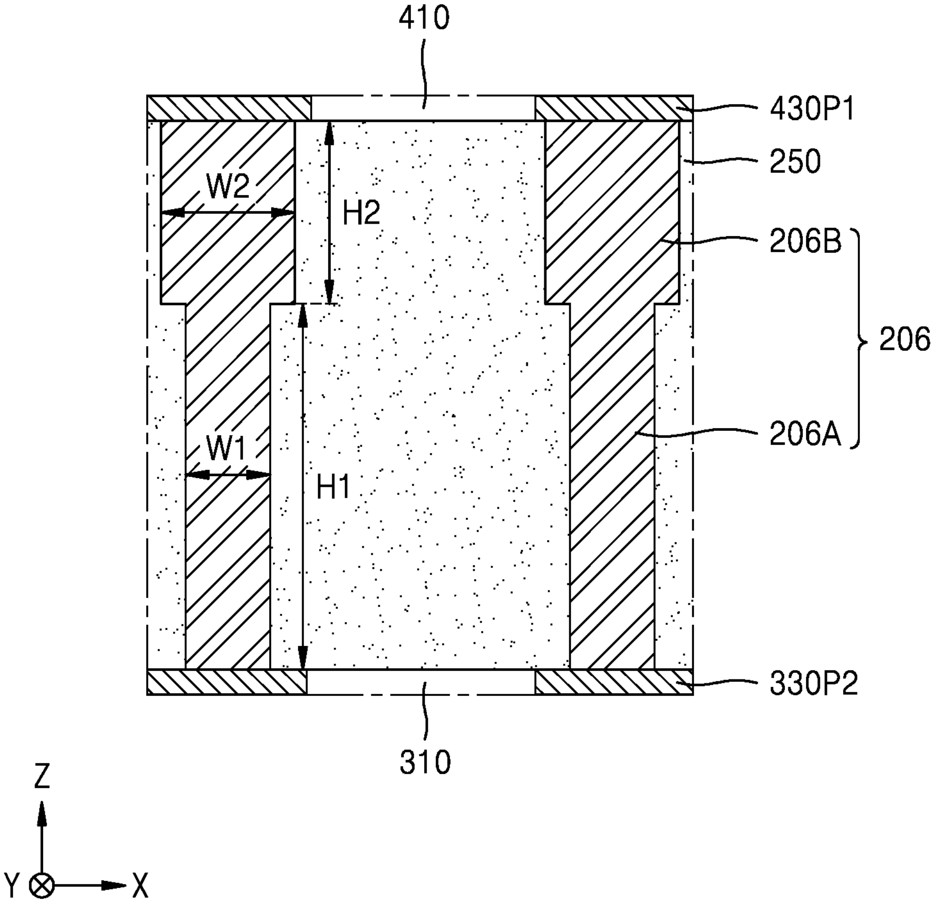

FIGS. 4A and 4B are each enlarged cross-sectional views of a portion CX of FIG. 1 according to some other embodiments of the present inventive concept.

Referring to FIG. 4A, conductive posts 205 may have rotational symmetry around the axis in a vertical direction (e.g., the Z direction) and may each have a cylindrical shape with a convex bottom.

A conductive post 205 may sequentially include a first portion 205A and a second portion 205B. The bottom surface of the first portion 205A may contact the top surface of the first top surface connection pad 330P2, and the top surface of the second portion 205B may contact the bottom surface of the second bottom surface connection pad 430P1.

In the conductive post 205, the first portion 205A and the second portion 205B may be formed to have concavo-convex shapes having step differences from each other. In detail, the conductive post 205 may have a cylindrical shape in which the first portion 205A corresponds to a convex portion. In other words, the first horizontal width W1 of the first portion 205A may be greater than the second horizontal width W2 of the second portion 205B. In some embodiments, a first height H1 of the first portion 205A of the conductive post 205 may be less than a second height H2 of the second portion 205B, but the inventive concept is not limited thereto. According to some other embodiments, the first height H1 of the conductive post 205 may be substantially equal to the second height H2 of the second portion 205B.

The structural features of the conductive post 205 as described above may appear as a multi-layer photoresist PR (refer to FIG. 10) including layers having different light transmittances is used, as in the method S10 of manufacturing a semiconductor package (refer to FIG. 5) described later.

Referring to FIG. 4B, conductive posts 206 may have rotational symmetry around the axis in a vertical direction (e.g., the Z direction) and may each have a cylindrical shape with a convex top.

A conductive post 206 may sequentially include a first portion 206A and a second portion 206B. The bottom surface of the first portion 206A may contact the top surface of the first top surface connection pad 330P2, and the top surface of the second portion 206B may contact the bottom surface of the second bottom surface connection pad 430P1.

In the conductive post 206, the first portion 206A and the second portion 206B may be formed to have concavo-convex shapes having step differences from each other. In detail, the conductive post 206 may have a cylindrical shape in which the second portion 206B corresponds to a convex portion. In other words, the first horizontal width W1 of the first portion 206A may be less than the second horizontal width W2 of the second portion 206B. In some embodiments, a first height H1 of the first portion 206A of the conductive post 206 may be greater than a second height H2 of the second portion 206B, but the inventive concept is not limited thereto. According to some other embodiments, the first height H1 of the conductive post 206 may be substantially equal to the second height H2 of the second portion 206B.

The structural features of the conductive post 206 as described above may appear as a multi-layer photoresist PR (refer to FIG. 10) including layers having different light transmittances is used, as in the method S10 of manufacturing a semiconductor package (refer to FIG. 5) described later.

In some embodiments, the conductive post (e.g., the conductive post 206 in FIG. 4B) has a step difference in width between the first portion (e.g., the first portion 206A in FIG. 4B) and the second portion (e.g., the second portion 206B in FIG. 4B), as illustrated in FIGS. 4A and 4B.

Figure 5:
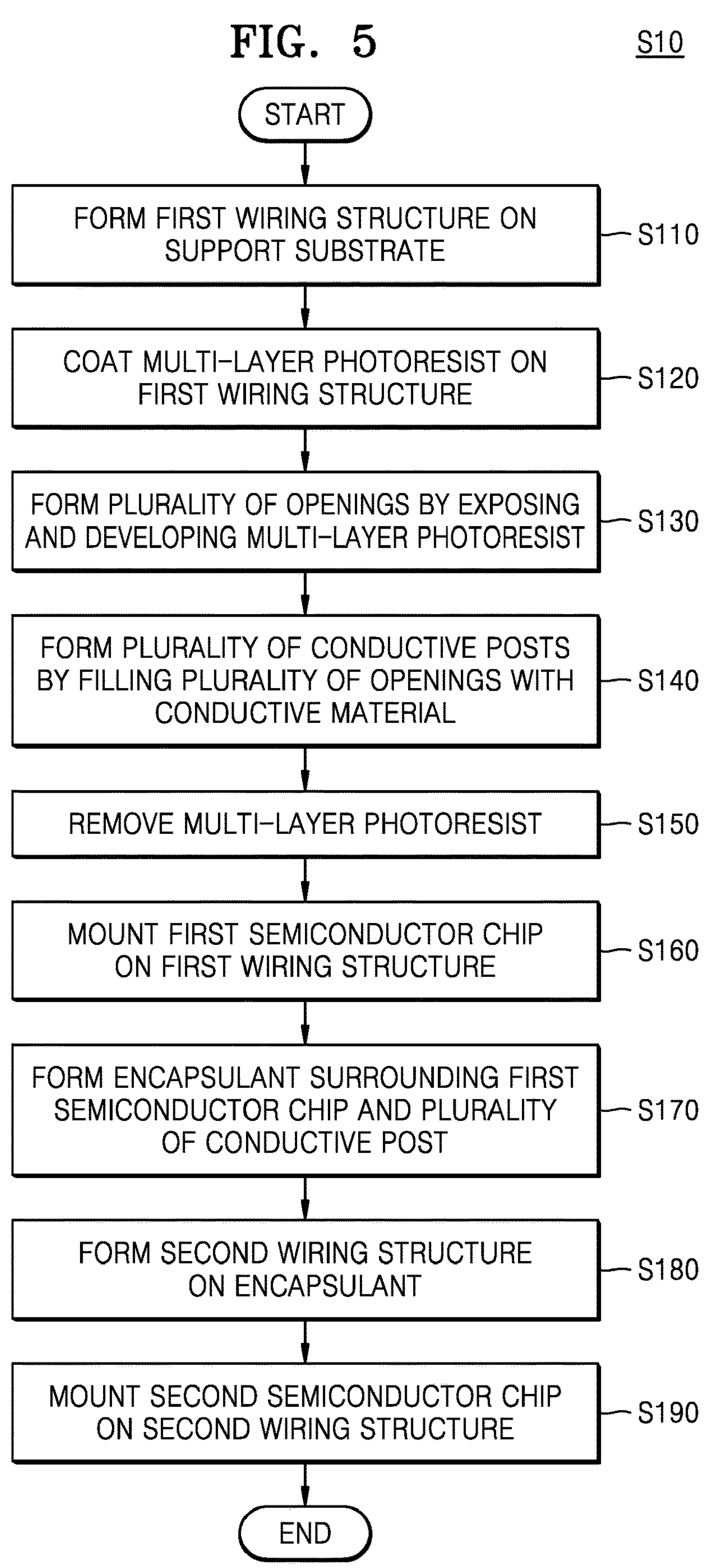
FIG. 5 is a flowchart of a method of manufacturing a semiconductor package, according to some embodiments of the present inventive concept.

FIG. 5 is a flowchart of a method of manufacturing a semiconductor package, according to some embodiments of the present inventive concept.

Referring to FIG. 5, the method S10 of manufacturing a semiconductor package may include operations S110 to S190.

In some embodiments that may be implemented otherwise, particular operations may be performed in an order different from that described below. For example, two successively described operations may be performed substantially and simultaneously or may be performed in an order opposite to the order described below. Moreover, the functionality of a given operation may be separated into multiple operations and/or the functionality of two or more operations may be at least partially integrated. Finally, other operations may be added/inserted between the operations that are illustrated, and/or operations may be omitted without departing from the scope of the present inventive concept.

The method S10 of manufacturing a semiconductor package according to the inventive concept may include operation S110 of forming a first wiring structure on a support substrate, operation S120 of coating a multi-layer photoresist PR on the first wiring structure, operation S130 of forming a plurality of openings by exposing and developing the multi-layer photoresist, operation S140 of forming a plurality of conductive posts by filling the plurality of openings with a conductive material, operation S150 of removing the multi-layer photoresist, operation S160 of mounting a first semiconductor chip on the first wiring structure, operation S170 of forming an encapsulant surrounding the first semiconductor chip and the plurality of conductive posts, operation S180 of forming a second wiring structure on the encapsulant, and operation S190 of mounting a second semiconductor chip on the second wiring structure.

The technical features of operations S110 to S190 are described below in detail with reference to FIGS. 6 to 16.

FIGS. 6 to 16 are diagrams illustrating a method of manufacturing a semiconductor package according to some embodiments of the present inventive concept. In some embodiments, processes/operations of the method may be performed sequentially as illustrated in FIGS. 6 to 16.

Figure 6:
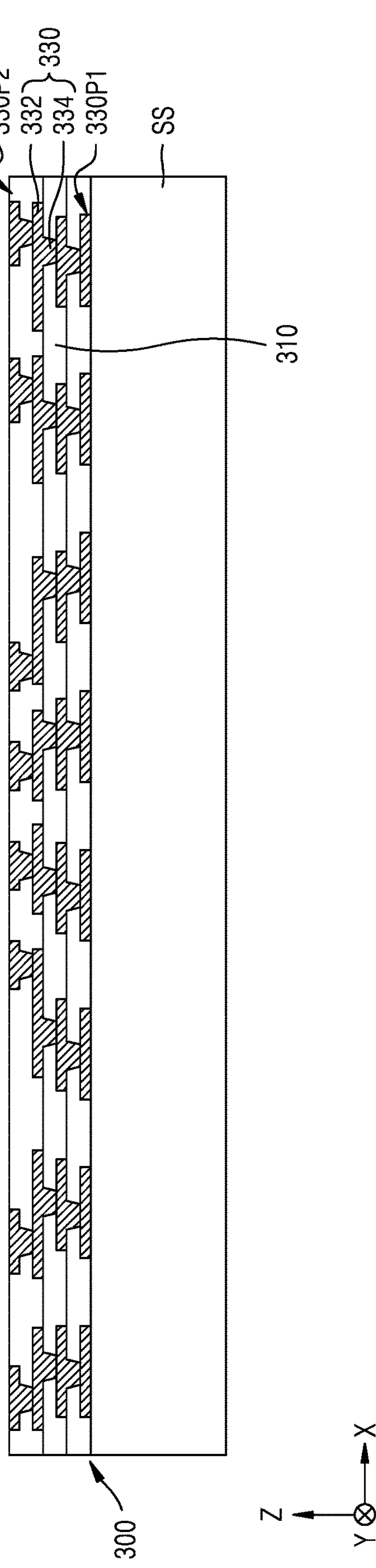

Referring to FIG. 6, the first wiring structure 300 including the plurality of first redistribution insulation layers 310 and the plurality of first redistribution patterns 330, which include the plurality of first redistribution line patterns 332 and the plurality of first redistribution vias 334, is formed on a support substrate SS.

The support substrate SS may be a semiconductor substrate, a glass substrate, a ceramic substrate, or a plastic substrate. In some embodiments, a release film may be attached onto the support substrate SS, and the first wiring structure 300 may be formed thereon.

The first redistribution line patterns 332 may be formed on the support substrate SS. The first redistribution line patterns 332 formed on the support substrate SS may include the plurality of first bottom surface connection pads 330P1.

Next, after a first preliminary redistribution insulation layer covering the first redistribution line patterns 332 is formed on the support substrate SS, the first redistribution insulation layers 310 having a plurality of first via holes may be formed by removing portions of the first preliminary redistribution insulation layer through an exposure process and a development process. The plurality of first via holes may each be formed, such that a horizontal width thereof decreases in a direction from the top surface of the first redistribution insulation layer 310 to the bottom surface of the first redistribution insulation layer 310. According to some embodiments, the plurality of first bottom surface connection pads 330P1 and the bottom surface of the lowermost first redistribution insulation layer 310 may be formed to be coplanar with each other.

After a first redistribution conductive layer is formed on the first redistribution insulation layer 310, the first redistribution conductive layer may be patterned, thereby forming the first redistribution patterns 330 including the first redistribution line patterns 332 and the first redistribution vias 334. The first redistribution vias 334 may be portions of the first redistribution patterns 330 that fill the plurality of first via holes, and the first redistribution line patterns 332 may be portions of the first redistribution patterns 330 above the top surface of the first redistribution insulation layers 310.

The first redistribution vias 334 may each be formed, such that a horizontal width thereof decreases in a direction from the top surface of the first redistribution insulation layer 310 to the bottom surface of the first redistribution insulation layer 310. Since the first redistribution patterns 330 including the first redistribution line patterns 332 and the first redistribution vias 334 are formed by patterning the first redistribution conductive layer, some of the first redistribution line patterns 332 formed on the first redistribution insulation layers 310 having the plurality of first via holes may be integrated with the first redistribution vias 334.

Next, the first wiring structure 300 may be formed by repeatedly forming the first redistribution insulation layers 310 and the first redistribution patterns 330. The first redistribution line patterns 332 formed to be arranged on the top surface of the first wiring structure 300 may be the plurality of first top surface connection pads 330P2. According to some embodiments, when the first wiring structure 300 is formed to include a plurality of stacked first redistribution insulation layers 310, the plurality of first top surface connection pads 330P2 may be the first redistribution line patterns 332 formed to be arranged on the top surface of the uppermost first redistribution insulation layer 310.

Figure 7:
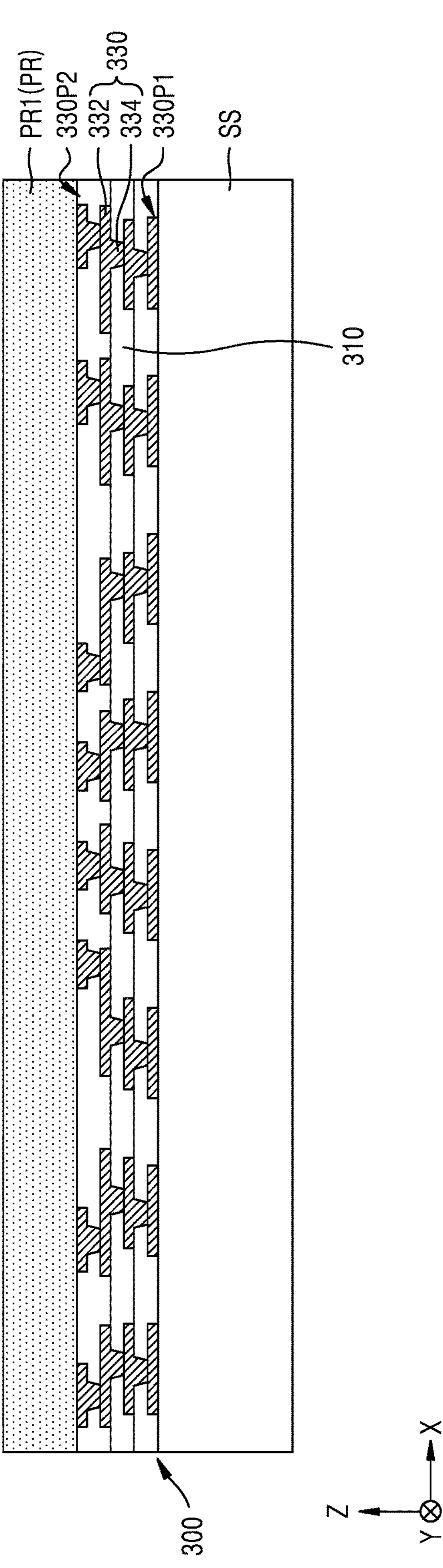

Referring to FIG. 7, a first photoresist layer PR1 constituting a portion of the multi-layer photoresist PR is formed on the first wiring structure 300 through first coating and baking.

According to some embodiments, the first photoresist layer PR1 may be a negative photoresist. In general, a negative photoresist used for negative tone development may be a chemically amplified photoresist material. Here, an exposed portion (i.e., a portion irradiated with light of or more than a threshold light amount) may remain, and a portion that is not exposed (that is, a portion not irradiated with light of or more than the threshold light amount) may be removed by a solvent.

According to some other embodiments, the first photoresist layer PR1 may be a positive photoresist. In general, a positive photoresist may include a photosensitive polymer having an acid-labile group, a potential acid, and a solvent. For example, the photosensitive polymer may include a (meth)acrylate-based polymer. The (meth)acrylate-based polymer may be an aliphatic (meth)acrylate-based polymer. Also, the photosensitive polymer may be substituted with various acid-labile protecting groups.

The first photoresist layer PR1 may have a first light transmittance. Also, the first photoresist layer PR1 may be formed to have a thickness of about ⅓ of the total thickness of the multi-layer photoresist PR to be finally formed. As described above, to form the plurality of conductive posts 200 (refer to FIG. 11) having a high aspect ratio according to design rules through a single exposure process and a single development process, a photoresist having a large thickness may be desired or needed. However, since it is difficult to obtain a desired thickness through a single coating process, a method of forming a multi-layer photoresist PR through a plurality of coating processes may be used.

Figure 8:
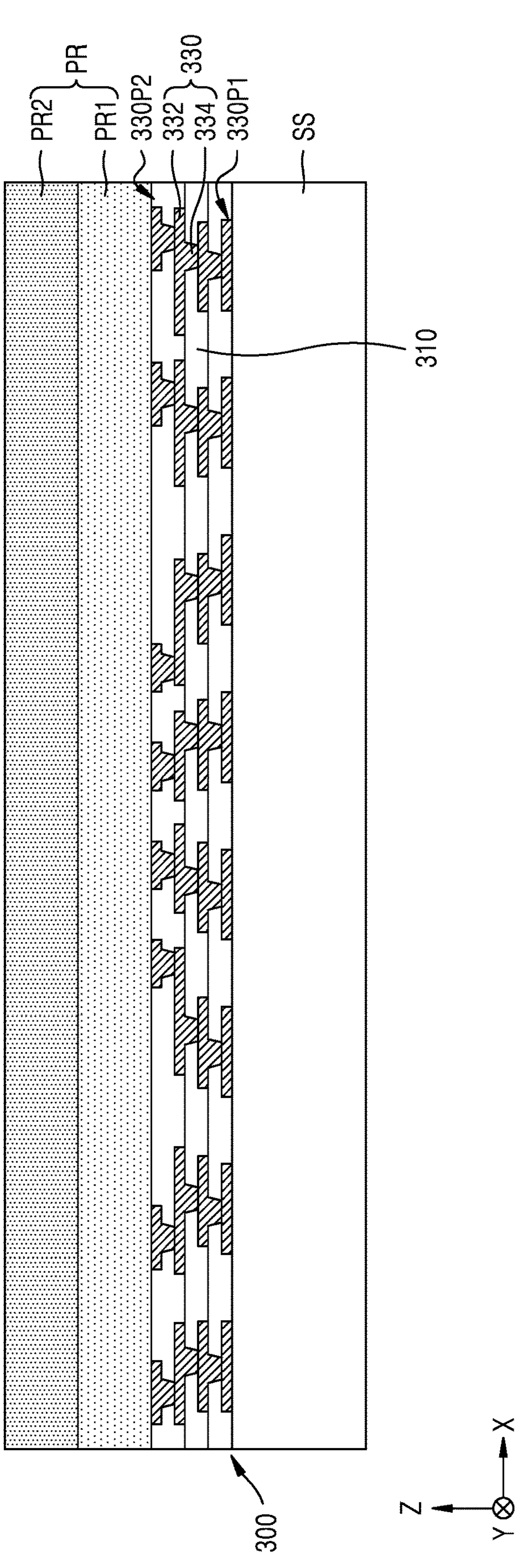

Referring to FIG. 8, a second photoresist layer PR2 constituting another portion of the multi-layer photoresist PR is formed through second coating and baking, on the previously formed first photoresist layer PR1.

The second photoresist layer PR2 may have a second light transmittance. Here, the first light transmittance of the first photoresist layer PR1 may be greater than the second light transmittance of the second photoresist layer PR2. In other words, the first light transmittance of the first photoresist layer PR1 disposed at a position where light is less likely to reach as compared to the second photoresist layer PR2 may be relatively increased to increase an amount of light reaching the first photoresist layer PR1.

Also, the second photoresist layer PR2 may be formed to have a thickness of about ⅓ of the total thickness of the multi-layer photoresist PR to be finally formed. Therefore, the first photoresist layer PR1 and the second photoresist layer PR2 may be formed to have a combined thickness of about ⅔ of the total thickness of the multi-layer photoresist PR to be finally formed.

Figure 9:
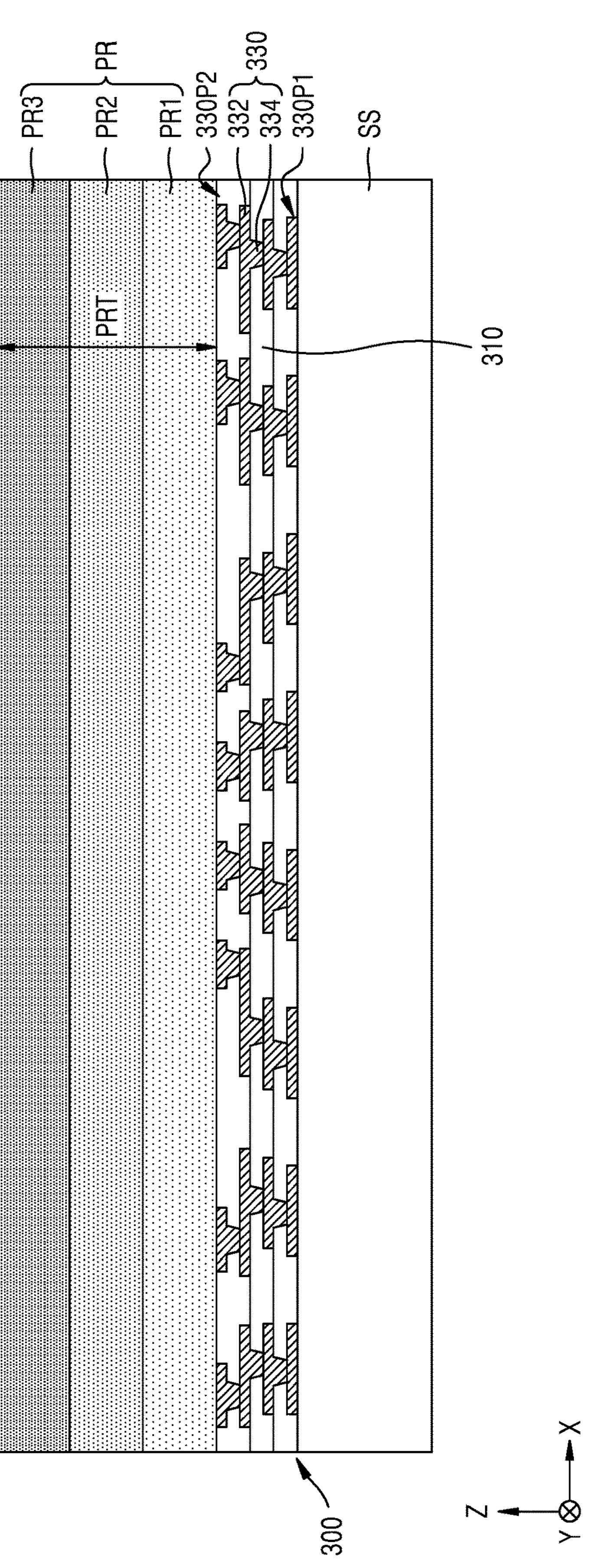

Referring to FIG. 9, a third photoresist layer PR3 constituting another portion of the multi-layer photoresist PR is formed through third coating and baking, on the previously formed second photoresist layer PR2.

The third photoresist layer PR3 may have a third light transmittance. Here, the second light transmittance of the second photoresist layer PR2 may be greater than the third light transmittance of the third photoresist layer PR3. In other words, the second light transmittance of the second photoresist layer PR2 disposed at a position where light is less likely to reach as compared to the third photoresist layer PR3 may be relatively increased to increase an amount of light reaching the second photoresist layer PR2.

Also, the third photoresist layer PR3 may be formed to have a thickness of about ⅓ of a total thickness PRT of the multi-layer photoresist PR to be finally formed. Therefore, the first photoresist layer PR1, the second photoresist layer PR2, and the third photoresist layer PR3 may be formed to have a combined thickness equal to the total thickness PRT of the multi-layer photoresist PR to be finally formed.

As a result, the total thickness PRT of the multi-layer photoresist PR may be from about 260 μm to about 500 μm, but the inventive concept is not limited thereto.

Figure 10:
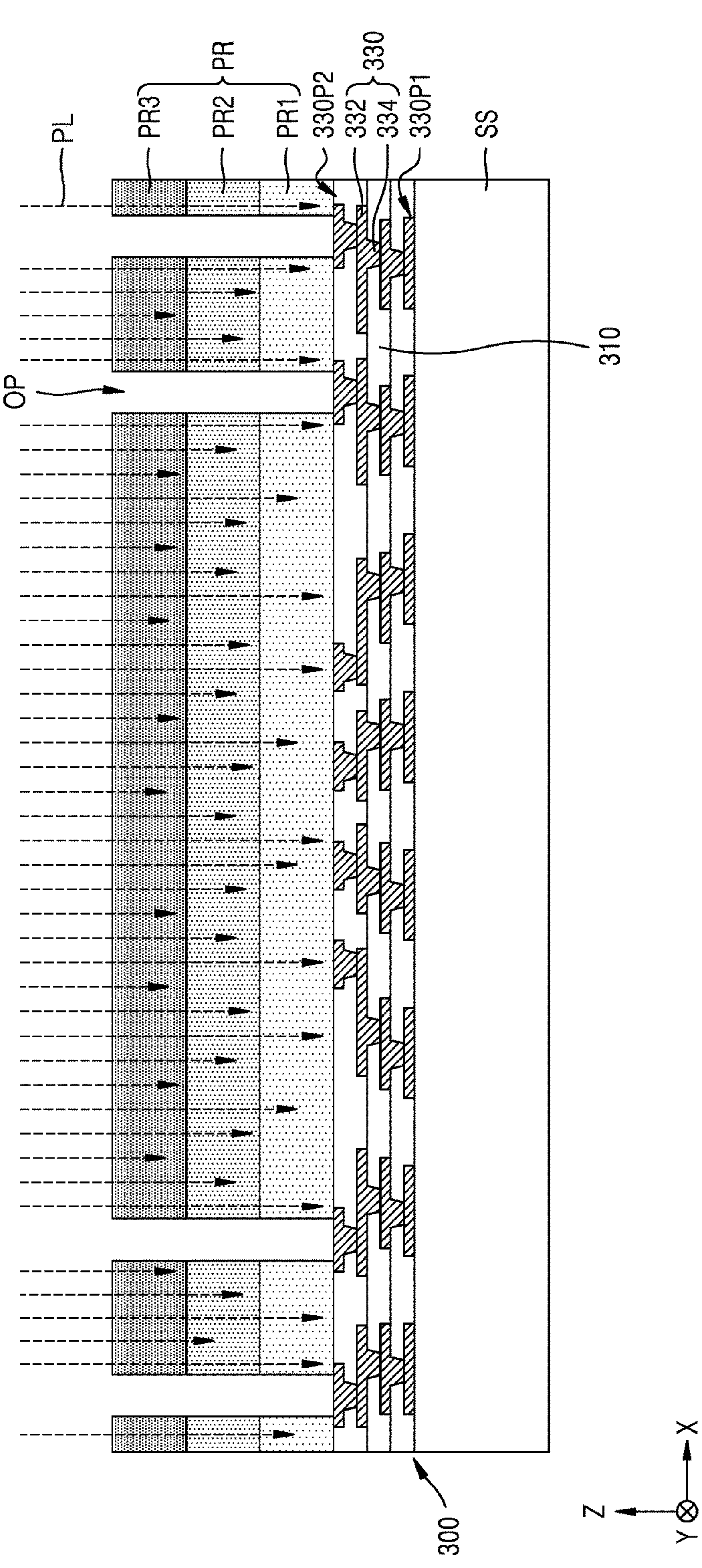

Referring to FIG. 10, a plurality of openings OP are formed on the outer region (e.g., the outer region 300*b* in FIG. 1) of the first wiring structure 300 by exposing and developing the multi-layer photoresist PR.

Through an exposure process and a development process, the plurality of openings OP having a high aspect ratio may be regularly formed on the outer region of the first wiring structure 300. As described above, an exposure process and a development process may be performed by using the multi-layer photoresist PR to reduce a phenomenon in which the width of the bottom portion of the opening OP becomes excessively wider or narrower than an intended width (e.g., a predetermined width).

In detail, the multi-layer photoresist PR may include a photosensitive material including a resin, a solvent, a photo active compound (PAC), a photo acid generator (PAG), and an additive. In some embodiments, the first light transmittance, the second light transmittance and the third light transmittance may depend on a content of the PAC and/or a content of the PAG included in the first photoresist layer PR1, the second photoresist layer PR2, and the third photoresist layer PR3. By adjusting the content of the PAC and/or the content of the PAG included in the first photoresist layer PR1, the second photoresist layer PR2, and the third photoresist layer PR3 constituting the multi-layer photoresist PR, the first light transmittance, the second light transmittance, and the third light transmittance may be adjusted, respectively. In this regard, the light transmittance of the multi-layer photoresist PR may increase toward the bottom of the multi-layer photoresist PR as compared to a general photoresist.

In other words, an environment in which light PL of a certain amount or more may be transmitted to the first photoresist layer PR1 positioned at the bottom may be configured. In detail, the content of the PAC and/or content of the PAG may be adjusted, such that the light PL reaches a position where the first wiring structure 300 and the first photoresist layer PR1 contact each other.

In this regard, by maintaining a relatively high light transmittance even at the bottom surface of the multi-layer photoresist PR, the phenomenon that a width of the bottom portion of an opening OP having a relatively high aspect ratio becomes excessively wider or narrower than an intended width may be efficiently suppressed.

Figure 11:
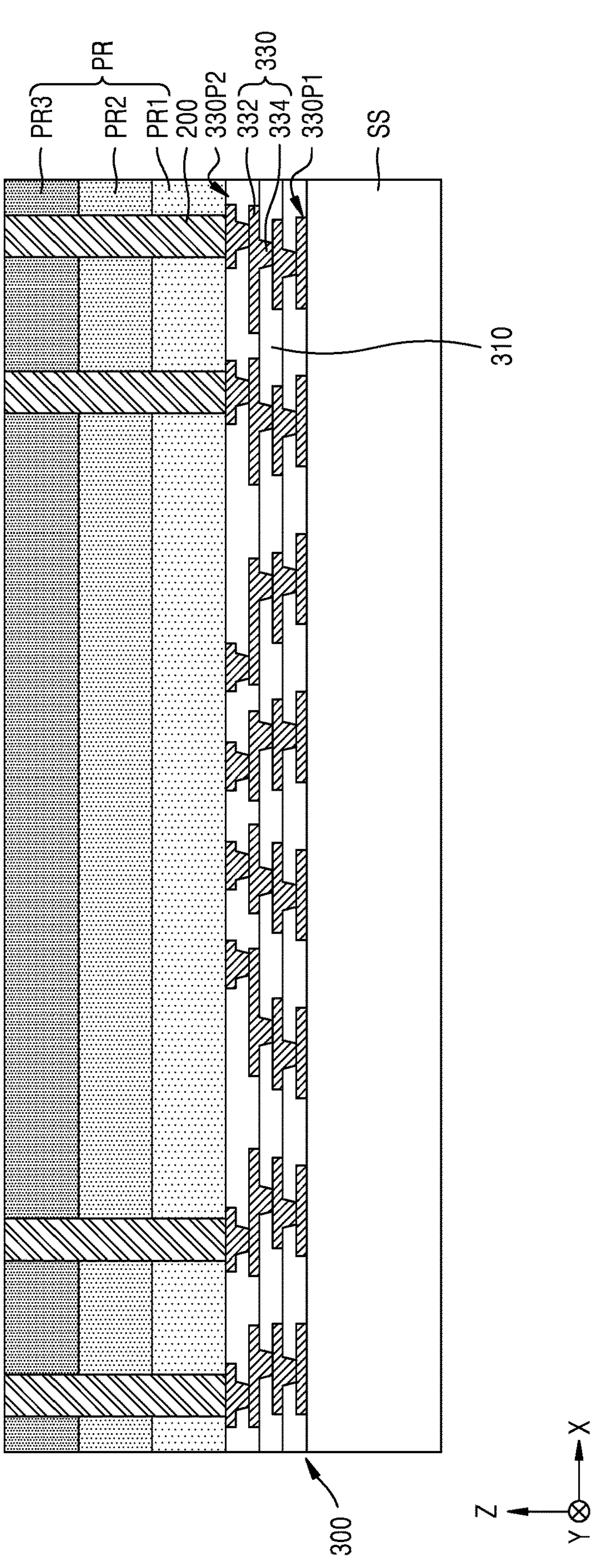

Referring to FIG. 11, the plurality of conductive posts 200 electrically connected to the plurality of first top surface connection pads 330P2 arranged in an outer region are formed by filling the plurality of openings OP (refer to FIG. 10) with a conductive material.

The plurality of conductive posts 200 may be formed by using, for example, an electroplating method. According to the inventive concept, the plurality of conductive posts 200 satisfying a desired shape may be formed through a single exposure process and a single development process by using a multi-layer photoresist PR and a single plating process according thereto. According to some embodiments, the conductive material may include, for example, Cu or a Cu alloy, but the inventive concept is not limited thereto.

In detail, the plurality of first top surface connection pads 330P2 may serve as seed layers for forming the plurality of conductive posts 200. In other words, when the plurality of conductive posts 200 are formed through an electroplating process, the plurality of first top surface connection pads 330P2 provide a path through which currents may flow, and thus the plurality of conductive posts 200 may be formed on the plurality of first top surface connection pads 330P2.

Here, the plurality of conductive posts 200 may be fabricated in various shapes by differently adjusting light transmittances of the first photoresist layer PR1, the second photoresist layer PR2, and the third photoresist layer PR3 constituting the multi-layer photoresist PR.

Embodiments of various shapes of the plurality of conductive posts 200 are as described above with reference to FIGS. 2A to 4B. In other words, a plurality of conductive posts 201, 202, 203, 204, 205, and 206 may include first portions 201A, 202A, 203A, 204A, 205A, and 206A that are formed in the first photoresist layer PR1 and contact sidewalls of the first photoresist layer PR1, a first portion 206A and second portions 201B, 202B, 203B, 204B, and 205B that are formed in the second photoresist layer PR2 and contact sidewalls of the second photoresist layer PR2, and second portions 205B and 206B and third portions 201C, 202C, 203C, and 204C that are formed in the third photoresist layer PR3 and contacting sidewalls of the third photoresist layer PR3.

Figure 12:
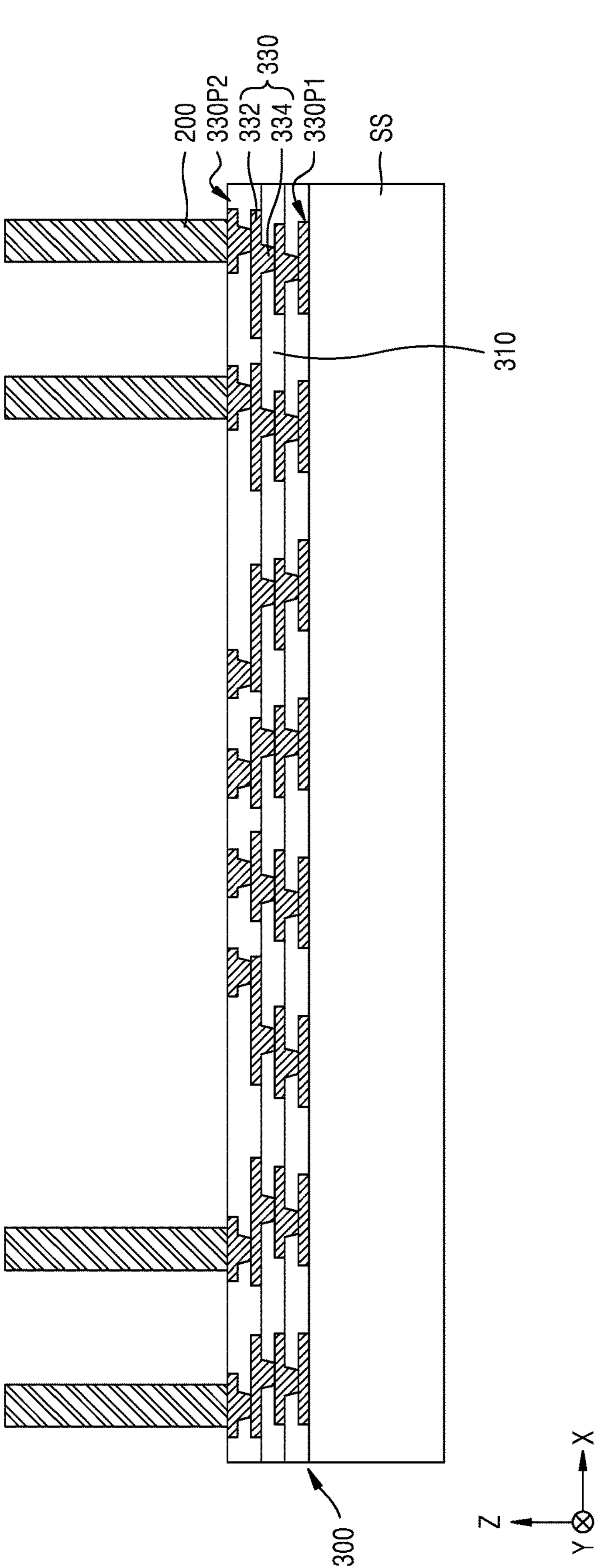

Referring to FIG. 12, after the plurality of conductive posts 200 are formed, the multi-layer photoresist PR (refer to FIG. 11) is removed.

A stripping process and/or an ashing process may be performed to remove the multi-layer photoresist PR (refer to FIG. 11). As the multi-layer photoresist PR (refer to FIG. 11) is removed, the plurality of conductive posts 200 may be arranged on the outer region of the first wiring structure 300 in various shapes as described above with reference to FIGS. 2A to 4B.

Figure 13:
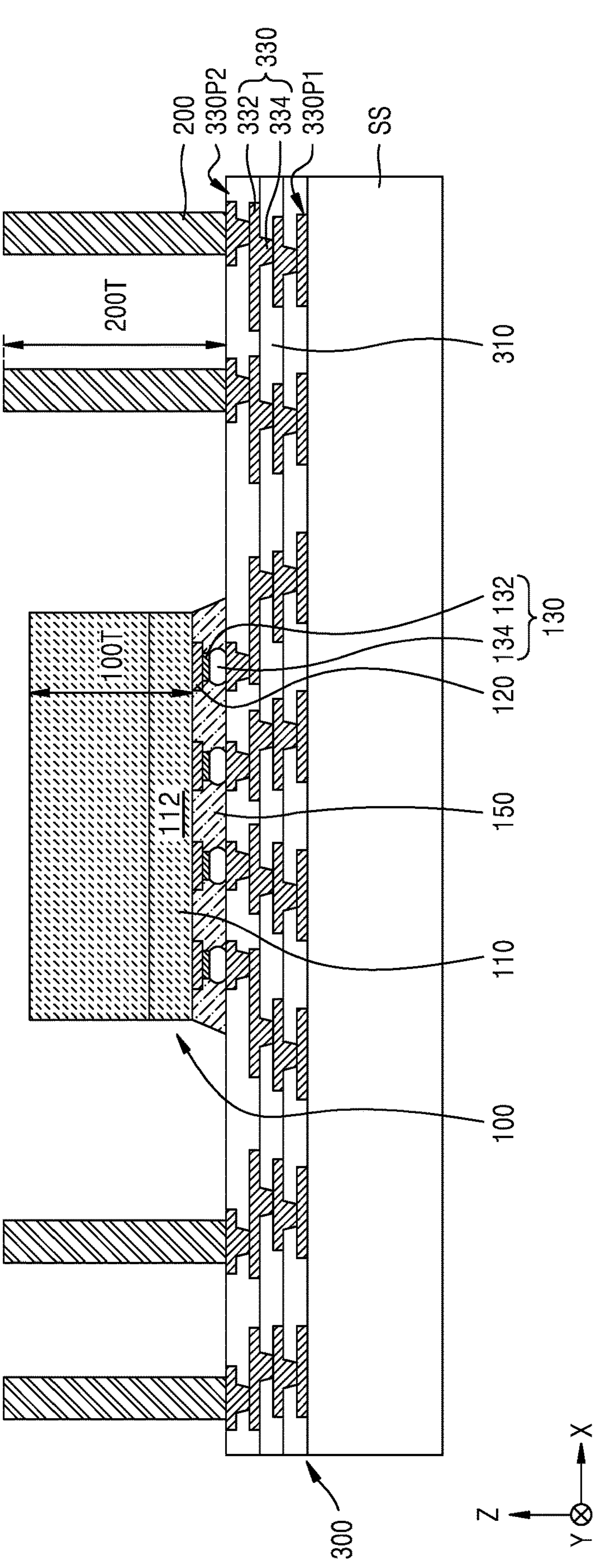

Referring to FIG. 13, the first semiconductor chip 100 including the plurality of chip pads 120 is mounted on the first wiring structure 300.

The first semiconductor chip 100 may be mounted on the first wiring structure 300, such that the plurality of chip connecting members 130 are provided between the plurality of chip pads 120 and some of the plurality of first top surface connection pads 330P2 of the first wiring structure 300.

The first semiconductor chip 100 may be mounted on a chip mounting region (e.g., the chip mounting region 300*a* in FIG. 1) of the first wiring structure 300 to be spaced apart from the plurality of conductive posts 200 in a horizontal direction. In detail, the plurality of chip connecting members 130 each including the UBM layer 132 and the conductive connection member 134 covering the UBM layer 132 are respectively formed on the plurality of chip pads 120 of the first semiconductor chip 100, and the first semiconductor chip 100 having formed therein the plurality of chip connecting members 130 may be mounted on the first wiring structure 300.

The underfill layer 150 may be formed to fill a space between the first semiconductor chip 100 and the first wiring structure 300. The underfill layer 150 may be formed to surround the plurality of chip connecting members 130. According to some embodiments, the underfill layer 150 may be formed to fill a space between the first semiconductor chip 100 and the first wiring structure 300 and may cover lower portions of side surfaces of the first semiconductor chip 100.

Figure 14:
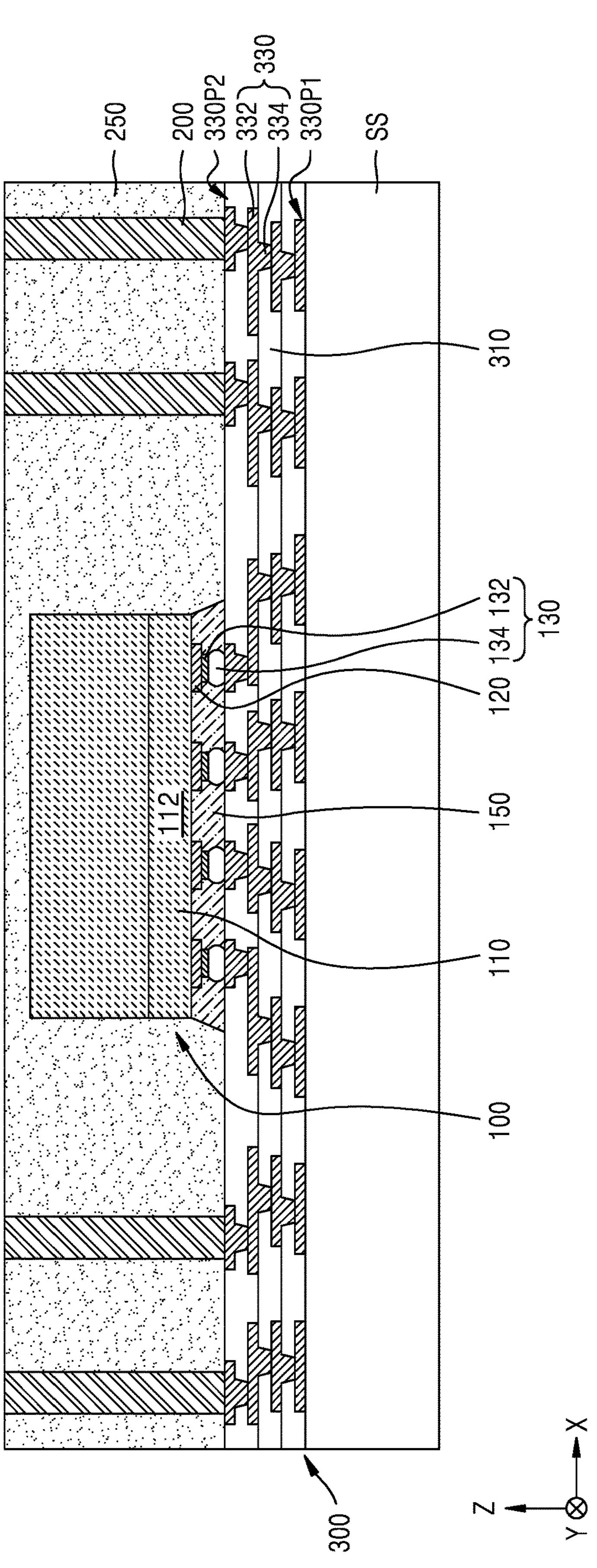

Referring to FIG. 14, the encapsulant 250 covering the first semiconductor chip 100 and the plurality of conductive posts 200 is formed.

To cover the top surfaces of all of the plurality of conductive posts 200, the encapsulant 250 may be formed to have a top surface positioned at a higher vertical level than the top of the plurality of conductive posts 200.

Next, a portion of the encapsulant 250 is removed to expose the plurality of conductive posts 200. In other words, a portion of the upper portion of the encapsulant 250 may be removed through, for example, a chemical mechanical polishing (CMP) process. The encapsulant 250 may include a molding member containing an epoxy mold compound.

Figure 15:
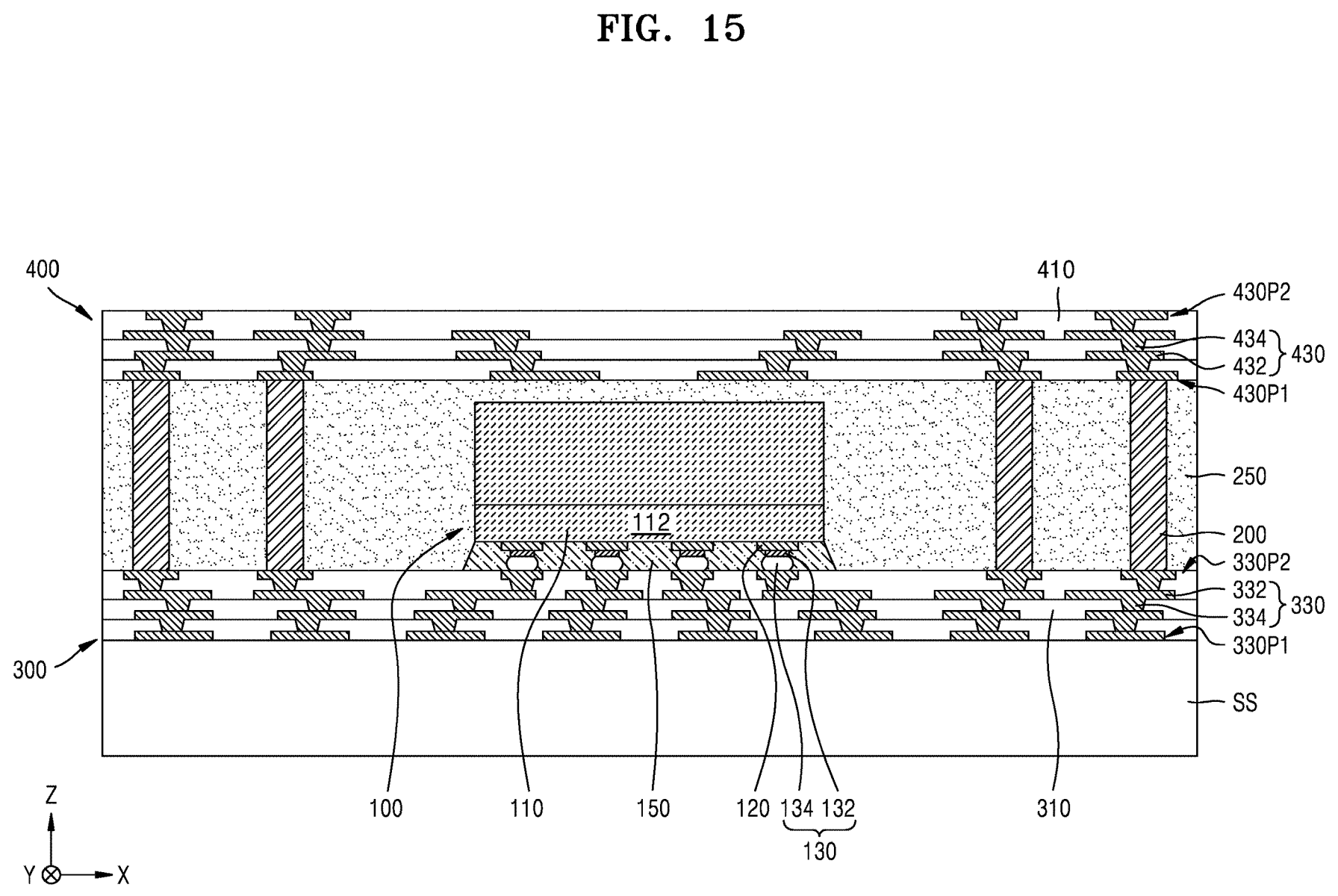

Referring to FIG. 15, the second wiring structure 400 including the second redistribution insulation layer 410 and the plurality of second redistribution patterns 430, which include the plurality of second redistribution line patterns 432, and the plurality of second redistribution vias 434, is formed on the plurality of conductive posts 200 and the encapsulant 250.

After a second preliminary redistribution insulation layer is formed on the plurality of conductive posts 200 and the encapsulant 250, a portion of the second preliminary redistribution insulation layer may be removed through an exposure process and a development process, thereby forming a plurality of second redistribution insulation layers 410 having a plurality of second via holes.

The plurality of second via holes may each be formed, such that a horizontal width thereof decreases in a direction from the top surface of the second redistribution insulation layer 410 to the bottom surface of the second redistribution insulation layer 410. After a second redistribution conductive layer is formed on the second redistribution insulation layer 410, the second redistribution conductive layer may be patterned, thereby forming the second redistribution patterns 430 including the second redistribution line patterns 432 and the second redistribution vias 434.

The second redistribution vias 434 formed on the plurality of conductive posts 200 may be the plurality of second bottom surface connection pads 430P1. The second redistribution vias 434 may be portions of the second redistribution patterns 430 that fill the plurality of second via holes, and the second redistribution line patterns 432 may be portions of the second redistribution patterns 430 above the top surface of the second redistribution insulation layers 410. The second redistribution vias 434 may each be formed, such that a horizontal width thereof decreases in a direction from the top surface of the second redistribution insulation layer 410 to the bottom surface of the second redistribution insulation layer 410. Since the second redistribution patterns 430 including the second redistribution line patterns 432 and the second redistribution vias 434 are formed by patterning the second redistribution conductive layer, some of the second redistribution line patterns 432 formed on the second redistribution insulation layers 410 having the plurality of second via holes may be integrated with the second redistribution vias 434.

Next, the second wiring structure 400 may be formed by repeatedly forming the second redistribution insulation layers 410 and the second redistribution patterns 430. According to some embodiments, the bottom surfaces of the plurality of second bottom surface connection pads 430P1 and the bottom surface of the lowermost second redistribution insulation layer 410 may be formed to be coplanar with each other.

Figure 16:
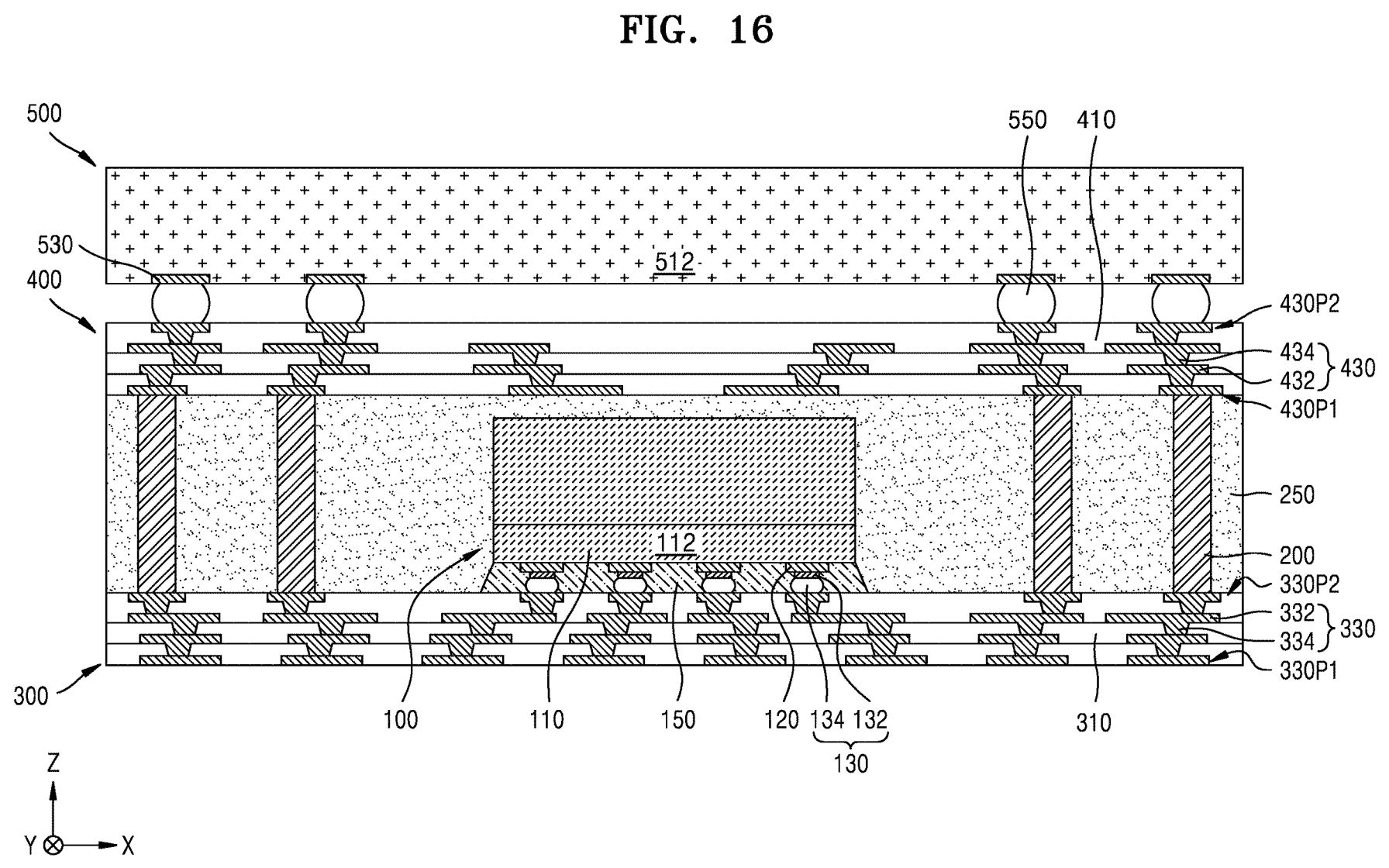

Referring to FIG. 16, the second semiconductor chip 500 is mounted to be electrically connected to the second wiring structure 400.

The second semiconductor chip 500 may be mounted on the second wiring structure 400, such that the plurality of second pads 530 face the second wiring structure 400.

According to some embodiments, the second semiconductor chip 500 may be electrically connected to the plurality of first redistribution patterns 330 of the first wiring structure 300 through the plurality of internal connection terminals 550 attached to the plurality of second pads 530, the plurality of second redistribution patterns 430, and the plurality of conductive posts 200.

Referring back to FIG. 1, the semiconductor package 10 may be completed by attaching the plurality of external connection terminals 600 to the plurality of first bottom surface connection pads 330P1.

As described above, according to the method of manufacturing a semiconductor package according to the inventive concept, by using a multi-layer photoresist PR (refer to FIG. 10), the plurality of conductive posts 200 having a high aspect ratio may be formed precisely according to design rules through a single exposure process, a single development process, and a single plating process.

Figure 17:
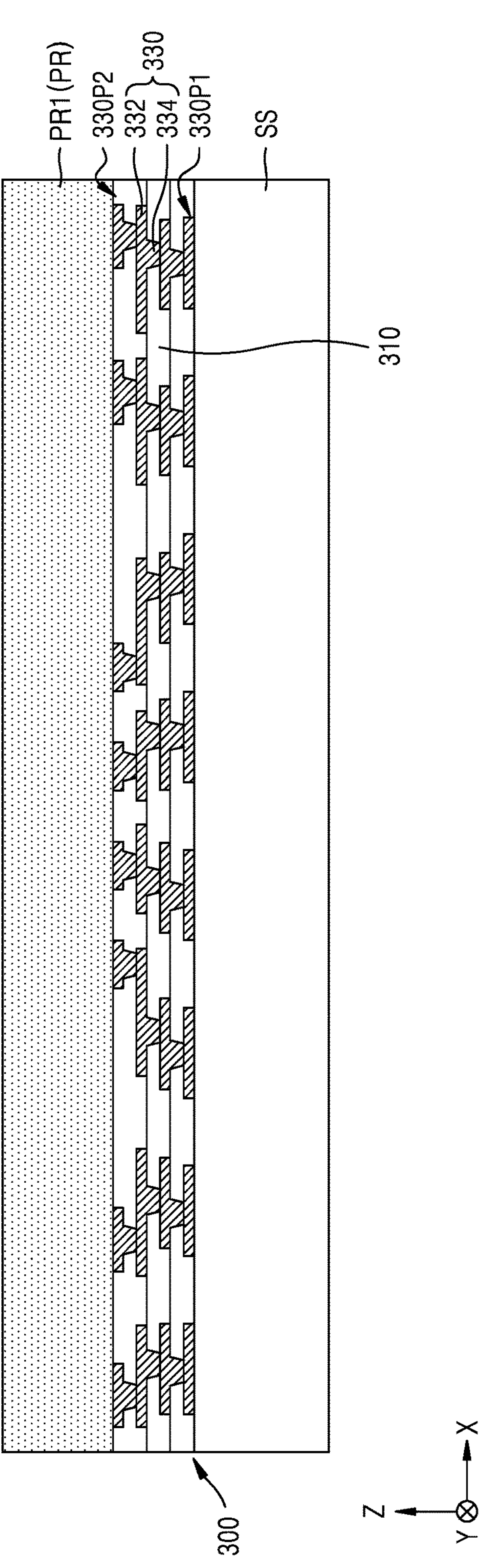
FIGS. 17 to 19 are diagrams showing a method of manufacturing a semiconductor package according to some other embodiments of the present inventive concept.
Figure 18:
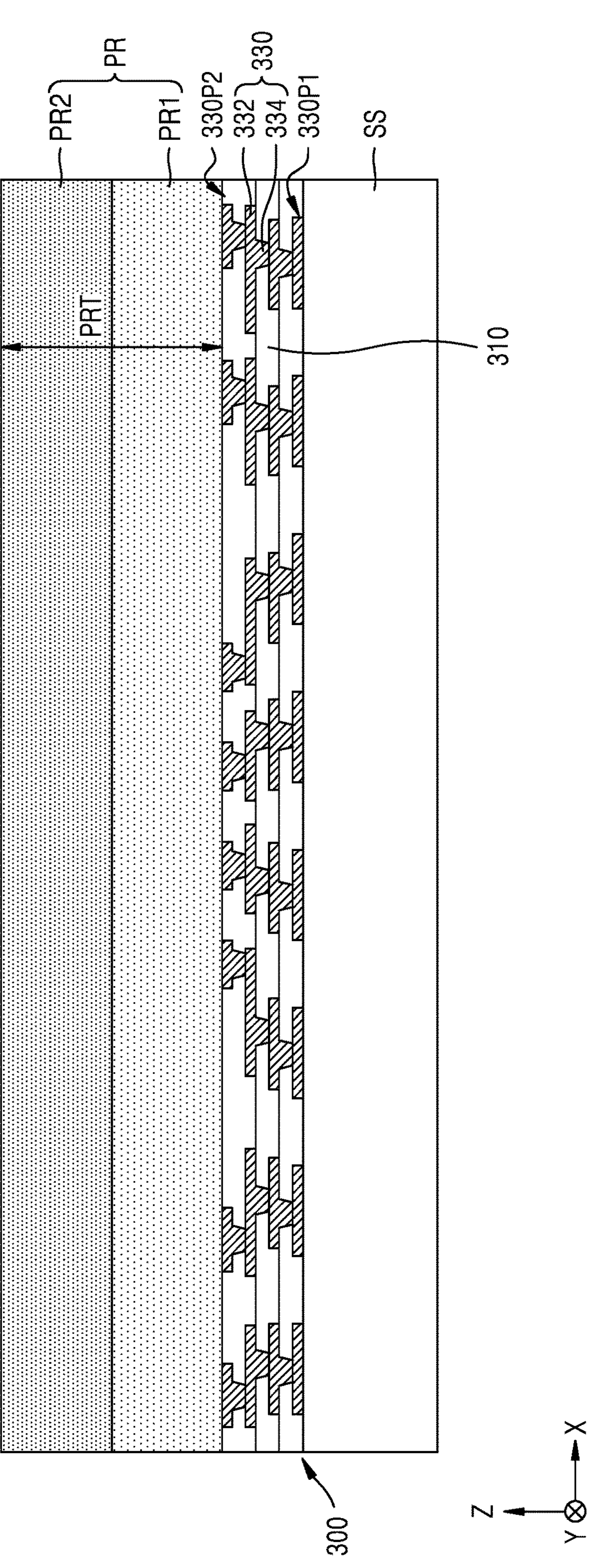
Figure 19:
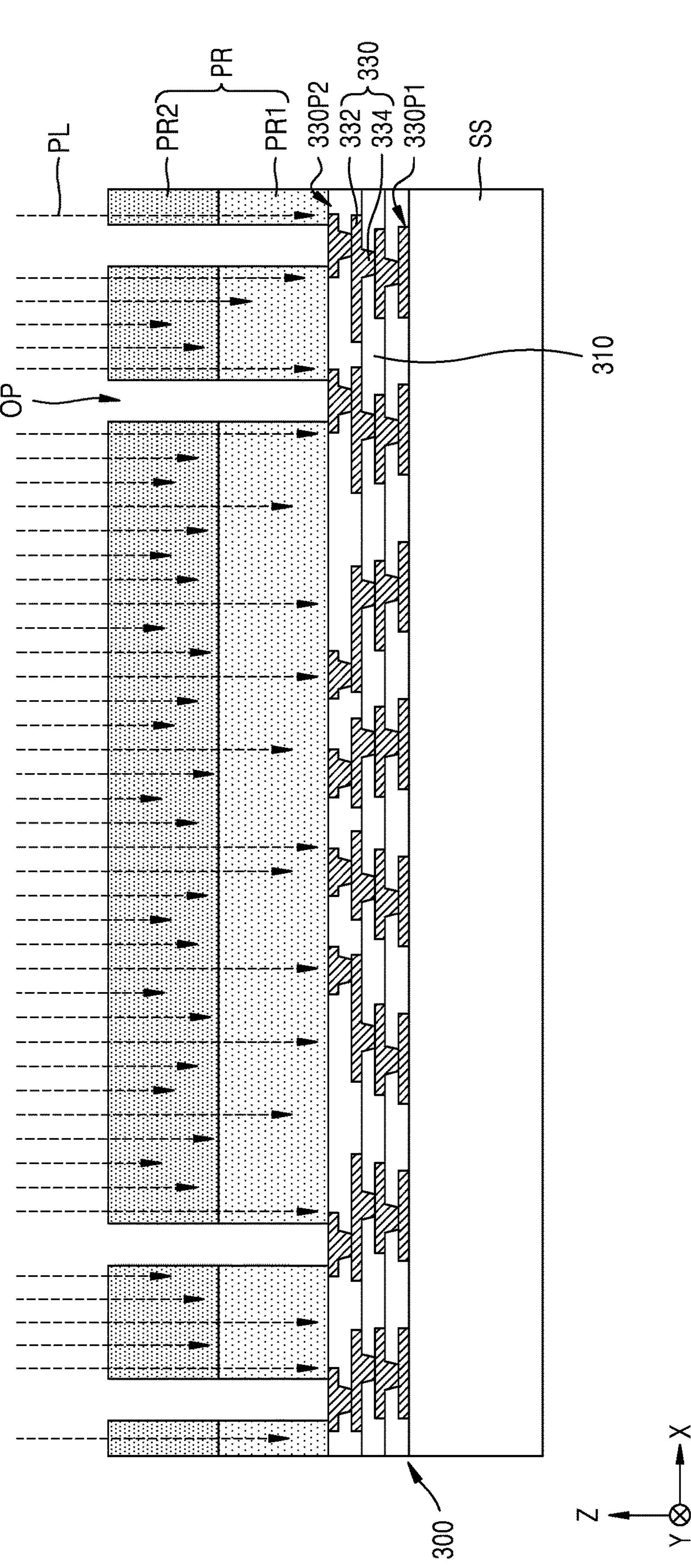

FIGS. 17 to 19 are diagrams illustrating a method of manufacturing a semiconductor package according to some other embodiments of the present inventive concept. In some embodiments, processes/operations of the method may be performed sequentially as illustrated in FIGS. 17 to 19.

Since most of the process sequence is substantially the same as that previously described above with reference to FIGS. 6 to 16, differences therebetween will be described here.

Referring to FIG. 17, the first photoresist layer PR1 constituting a portion of a two-layer photoresist PR is formed on the first wiring structure 300 through first coating and baking.

The first photoresist layer PR1 may have a first light transmittance. Also, the first photoresist layer PR1 may be formed to have a thickness of about ½ of the total thickness of the two-layer photoresist PR to be finally formed.

Referring to FIG. 18, the second photoresist layer PR2 constituting the remaining of the two-layer photoresist PR is formed through second coating and baking, on the previously formed first photoresist layer PR1.

The second photoresist layer PR2 may have a second light transmittance. Here, the first light transmittance of the first photoresist layer PR1 may be greater than the second light transmittance of the second photoresist layer PR2. In other words, the first light transmittance of the first photoresist layer PR1 disposed at a position where light is less likely to reach as compared to the second photoresist layer PR2 may be relatively increased to increase an amount of light reaching the first photoresist layer PR1.

Also, the second photoresist layer PR2 may be formed to have a thickness of about ½ of the total thickness PRT of the two-layer photoresist PR to be finally formed. Therefore, the first photoresist layer PR1 and the second photoresist layer PR2 may be formed to have a combined thickness equal to the total thickness PRT of the two-layer photoresist PR to be finally formed. The total thickness PRT of the two-layer photoresist PR may be from about 260 μm to about 500 μm, but is not limited thereto.

Referring to FIG. 19, the plurality of openings OP are formed on the outer region of the first wiring structure 300 by exposing and developing the two-layer photoresist PR.

Through an exposure process and a development process, the plurality of openings OP having a high aspect ratio may be regularly formed on the outer region of the first wiring structure 300. In other words, an exposure process and a development process may be performed by using the two-layer photoresist PR.

By adjusting the content of a PAC and/or a PAG included in the first photoresist layer PR1 and the second photoresist layer PR2 constituting the two-layer photoresist PR, the first light transmittance and the second light transmittance may be adjusted, respectively. In this regard, the light transmittance of the two-layer photoresist PR may increase toward the bottom of the two-layer photoresist PR as compared to a general photoresist.

In other words, an environment in which light PL of a certain amount or more may be transmitted to the first photoresist layer PR1 positioned at the bottom may be configured.

In this regard, by maintaining a relatively high light transmittance even at the bottom surface of the two-layer photoresist PR, the phenomenon that a width of the bottom portion of an opening OP having a relatively high aspect ratio becomes excessively wider or narrower than an intended width may be efficiently suppressed.

Also, the plurality of conductive posts 200 (refer to FIG. 1) may be fabricated in various shapes by differently adjusting light transmittances of the first photoresist layer PR1 and the second photoresist layer PR2 constituting the two-layer photoresist PR. Since embodiments of various shapes of the plurality of conductive posts 200 (refer to FIG. 1) have been described above with reference to FIGS. 4A and 4B, detailed descriptions thereof will be omitted below.

Figure 20:
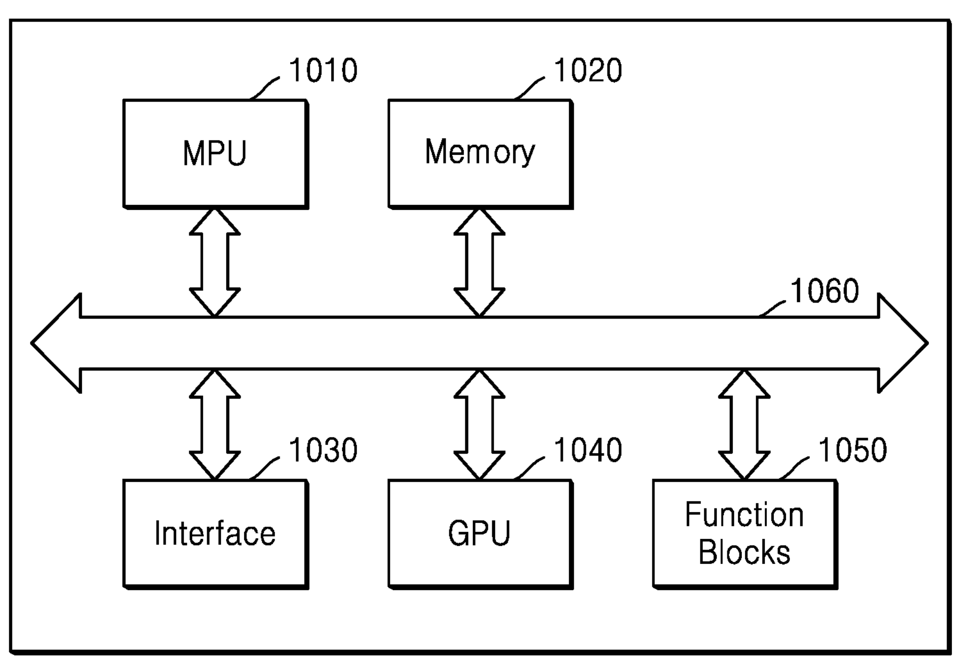
FIG. 20 is a diagram schematically illustrating a configuration of a semiconductor package according to some embodiments of the present inventive concept.

FIG. 20 is a diagram schematically illustrating a configuration of a semiconductor package according to some embodiments of the present inventive concept.

Referring to FIG. 20, a semiconductor package 1000 may include a microprocessor 1010, a memory 1020, an interface 1030, a graphics processing unit 1040, functional blocks 1050, and a bus 1060 connecting them to one another.

The semiconductor package 1000 may include both the microprocessor 1010 and the graphics processing unit 1040 or may include only one of them.

The microprocessor 1010 may include a core and a cache. For example, the microprocessor 1010 may include multi-cores. Cores of the multi-cores may have performance same as or different from one another. Also, the core of the multi-cores may be activated at the same time or may be activated at different times.

The memory 1020 may store results processed by the functional blocks 1050 under the control of the microprocessor 1010. The interface 1030 may exchange information or signals with external devices. The graphics processing unit 1040 may perform graphic functions. For example, the graphics processing unit 1040 may execute a video codec or process 3D graphics. The functional blocks 1050 may perform various functions. For example, when the semiconductor package 1000 is an application processor used in a mobile device, some of the functional blocks 1050 may perform a communication function.

The semiconductor package 1000 may include the semiconductor package 10 described above with reference to FIG. 1 and/or a semiconductor package manufactured according to the method S10 of manufacturing a semiconductor package described above with reference to FIG. 5.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure. As used herein, an element or region that is "covering" or "surrounding" or "filling" another element or region may completely or partially cover or surround or fill the other element or region.

While the inventive concept has been particularly shown and described with reference to some example embodiments thereof, it will be understood that various changes in form and details may be made therein without departing from the scope of the following claims. Accordingly, the above-disclosed subject matter is to be considered illustrative, and not restrictive, and the appended claims are intended to cover all such modifications, enhancements, and other embodiments, which fall within the scope of the inventive concept.

What is claimed is:

1. A method of manufacturing a semiconductor package, the method comprising:

forming a first wiring structure, which comprises a first insulation layer and a plurality of first wiring patterns that are in the first insulation layer and comprise a plurality of first connection pads, wherein the first wiring structure comprises a chip mounting region and an outer region extending around the chip mounting region;

forming a multi-layer photoresist on the first wiring structure;

forming a plurality of openings in the multi-layer photoresist on the outer region by exposing and developing the multi-layer photoresist;

forming a plurality of conductive posts respectively electrically connected to the plurality of first connection pads arranged in the outer region by forming a conductive material in the plurality of openings, removing the multi-layer photoresist;

providing a semiconductor chip on the chip mounting region of the first wiring structure;

forming an encapsulant in which the semiconductor chip and the plurality of conductive posts are disposed; and forming a second wiring structure on the encapsulant, the second wiring structure comprising a second insulation layer and a plurality of second wiring patterns that are in the second insulation layer and comprise a plurality of second connection pads respectively electrically connected to the plurality of conductive posts, wherein the multi-layer photoresist comprises at least two layers having different light transmittances.

2. The method of claim 1, wherein a thickness of the multi-layer photoresist is from about 260 μm to about 500 μm.

3. The method of claim 2, wherein the forming of the multi-layer photoresist comprises:

coating and baking a first photoresist layer having a first light transmittance on the first wiring structure;

coating and baking a second photoresist layer having a second light transmittance on the first photoresist layer; and coating and baking a third photoresist layer having a third light transmittance on the second photoresist layer, and the first light transmittance, the second light transmittance, and the third light transmittance are different from one another.

4. The method of claim 3, wherein the first light transmittance is greater than the second light transmittance, and the second light transmittance is greater than the third light transmittance.

5. The method of claim 3, wherein the multi-layer photoresist comprises a photosensitive material comprising a resin, a solvent, a photo active compound (PAC), a photo acid generator (PAG), and an additive, and the first light transmittance, the second light transmittance, and the third light transmittance depend on a content of the PAC or a content of the PAG in the photosensitive material.

6. The method of claim 3, wherein each of the plurality of conductive posts comprises:

a first portion contacting a sidewall of the first photoresist layer;

a second portion contacting a sidewall of the second photoresist layer; and a third portion contacting a sidewall of the third photoresist layer, and at least one of horizontal widths of the first portion, the second portion, and the third portion is different from the other horizontal widths.

7. The method of claim 6, wherein the plurality of conductive posts are formed through a single plating process.

8. The method of claim 2, wherein the forming of the multi-layer photoresist comprises:

coating and baking a first photoresist layer having a first light transmittance on the first wiring structure; and coating and baking a second photoresist layer having a second light transmittance on the first photoresist layer, and the first light transmittance and the second light transmittance are different from each other.

9. The method of claim 8, wherein the first light transmittance is greater than the second light transmittance.

10. The method of claim 8, wherein each of the plurality of conductive posts comprises:

a first portion contacting a sidewall of the first photoresist layer; and a second portion contacting a sidewall of the second photoresist layer, and a horizontal width of the first portion and a horizontal width of the second portion are different from each other.

11. A method of manufacturing a semiconductor package, the method comprising:

forming a first wiring structure comprising a chip mounting region and an outer region extending around the chip mounting region;

coating and baking a first photoresist layer having a first light transmittance on the first wiring structure;

coating and baking a second photoresist layer having a second light transmittance on the first photoresist layer;

coating and baking a third photoresist layer having a third light transmittance on the second photoresist layer;

forming a plurality of openings in the first, second and third photoresist layers on the outer region by exposing and developing the first photoresist layer, the second photoresist layer, and the third photoresist layer;

forming a plurality of conductive posts respectively in the plurality of openings by forming a conductive material in the plurality of openings through a single plating process;

removing the first photoresist layer, the second photoresist layer, and the third photoresist layer;

providing a semiconductor chip on the chip mounting region of the first wiring structure;

forming an encapsulant in which the semiconductor chip and the plurality of conductive posts are disposed; and forming a second wiring structure on the encapsulant, wherein at least one of the first light transmittance, the second light transmittance, and the third light transmittance is different from the other light transmittances.

12. The method of claim 11, wherein a sum of thicknesses of the first photoresist layer, the second photoresist layer, and the third photoresist layer is from about 260 μm to about 500 μm.

13. The method of claim 11, wherein the first light transmittance is greater than the second light transmittance, and the second light transmittance is greater than the third light transmittance, and the first light transmittance, the second light transmittance and the third light transmittance depend on a content of a photo active compound (PAC) or a content of a photo acid generator (PAG) included in the first photoresist layer, the second photoresist layer, and the third photoresist layer.

14. The method of claim 11, wherein a thickness of the plurality of conductive posts is at least about 200 μm, and an aspect ratio of the plurality of conductive posts is 1 or greater.

15. The method of claim 14, wherein each of the plurality of conductive posts comprises:

a first portion contacting a sidewall of the first photoresist layer;

a second portion contacting a sidewall of the second photoresist layer; and a third portion contacting a sidewall of the third photoresist layer, and wherein each of the plurality of conductive posts has a step difference in width between the first and second portions and has a step difference in width between the second and third portions.

16. A method of manufacturing a semiconductor package, the method comprising:

forming a first wiring structure comprising a first insulation layer and a plurality of first wiring patterns that are in the first insulation layer and comprise a plurality of first connection pads;

forming a multi-layer photoresist on the first wiring structure, the multi-layer photoresist comprising first and second photoresist layers, and the first photoresist layer extending between the first wiring structure and the second photoresist layer and having a first light transmittance different from a second light transmittance of the second photoresist layer;

forming a plurality of openings in the multi-layer photoresist;

forming a plurality of conductive posts in the plurality of openings, respectively;

removing the multi-layer photoresist;

providing a semiconductor chip on the first wiring structure, the semiconductor chip being spaced apart from the plurality of conductive posts;

forming an encapsulant in which the semiconductor chip and the plurality of conductive posts are disposed; and forming a second wiring structure on the encapsulant, the second wiring structure comprising a second insulation layer and a plurality of second wiring patterns that are in the second insulation layer and comprise a plurality of second connection pads, wherein each of the plurality of conductive posts is electrically connected to a respective one of the plurality of first connection pads and a respective one of plurality of second connection pads.

17. The method of claim 16, wherein the first light transmittance is greater than the second light transmittance.

18. The method of claim 17, wherein the multi-layer photoresist further comprises a third photoresist layer having a third light transmittance, and the second photoresist layer extends between the first and third photoresist layers, and the second light transmittance is greater than the third light transmittance.

19. The method of claim 16, wherein the plurality of conductive posts are formed by a single plating process.

20. The method of claim 16, wherein each of the plurality of conductive posts comprises a first portion formed in the first photoresist layer and a second portion formed in the second photoresist layer, and each of the plurality of conductive posts has a step difference in width between the first and second portions.

* * * * *